(12) United States Patent
Bowles et al.

(10) Patent No.: US 8,237,506 B1
(45) Date of Patent: Aug. 7, 2012

(54) DOHERTY AMPLIFIER AND METHOD FOR OPERATION THEREOF

(75) Inventors: Gregory J. Bowles, Nepean (CA); Scott Widdowson, Ottawa (CA)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/227,893

(22) Filed: Sep. 8, 2011

Related U.S. Application Data

(63) Continuation of application No. 12/482,110, filed on Jun. 10, 2009, now Pat. No. 8,022,768.

(60) Provisional application No. 61/139,244, filed on Dec. 19, 2008.

(51) Int. Cl.
*H03F 3/68* (2006.01)
(52) U.S. Cl. .................... 330/295; 330/124 R
(58) Field of Classification Search .............. 330/124 R, 330/295, 302
See application file for complete search history.

(56) References Cited

U.S. PATENT DOCUMENTS

| | | | |
|---|---|---|---|
| 6,262,629 B1* | 7/2001 | Stengel et al. | 330/124 R |
| 7,330,071 B1* | 2/2008 | Dening et al. | 330/124 R |
| 7,619,468 B1* | 11/2009 | Bowles et al. | 330/124 R |
| 2004/0113698 A1* | 6/2004 | Kim et al. | 330/295 |
| 2005/0024136 A1* | 2/2005 | Yamaguchi | 330/124 R |

* cited by examiner

*Primary Examiner* — Khanh V Nguyen
(74) *Attorney, Agent, or Firm* — Meyertons, Hood, Kivlin, Kowert & Goetzel, P.C.

(57) ABSTRACT

An amplifier having a Doherty-type architecture and a method for operation thereof are provided. The amplifier comprises a main amplifier path comprising a main amplifier, an auxiliary amplifier path comprising an auxiliary amplifier, and an signal preparation unit configured to develop a main amplifier input signal for the main amplifier path and an auxiliary amplifier input signal for the auxiliary amplifier path based on an amplifier input that is to be amplified and a transition threshold associated with the amplifier input. By driving the main and auxiliary amplifiers as a function of the transition threshold, the gain of the Doherty-type amplifier may be increased.

22 Claims, 20 Drawing Sheets

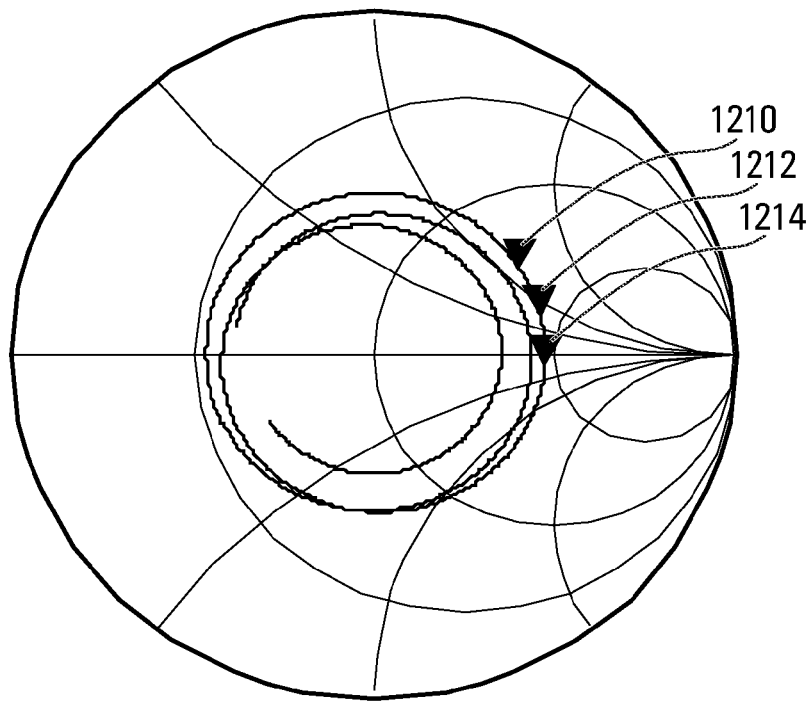
FIG. 12B
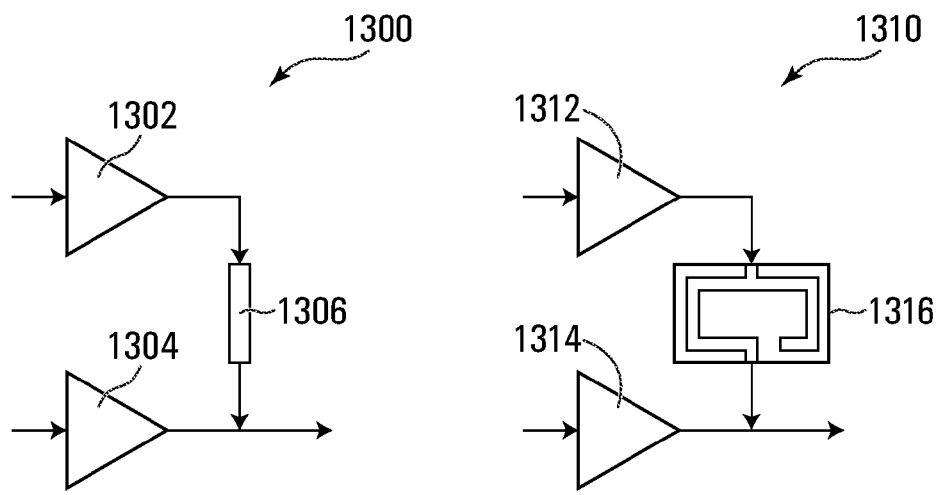
FIG. 13A  FIG. 13B

DOHERTY AMPLIFIER AND METHOD FOR OPERATION THEREOF

RELATED APPLICATION

The present patent application is a continuation of U.S. patent application Ser. No. 12/482,110, filed Jun. 10, 2009, now U.S. Pat. No. 8,022,768 and claims the benefit of U.S. Provisional Patent Application No. 61/139,244 filed Dec. 19, 2008, the entire contents of which are incorporated herein by reference.

FIELD OF THE INVENTION

The present invention relates to signal power amplification, and more specifically to Doherty-type power amplifiers.

BACKGROUND

Wireless devices use high frequency, generally referred to as Radio Frequency (RF), signals to transmit information through free space. For example, cell phones use amplified RF to transmit voice data to base stations, which allow signals to be relayed to communications networks. Other existing wireless communication devices include Bluetooth, HomeRF and WLAN. Note that the term "Radio Frequencies" is used herein to refer to any frequencies suitable for wireless communication, including Ultra High Frequency (UHF), Very High Frequency (VHF), Microwave Frequency, etc.

In a conventional wireless device, the power amplifier generally consumes most of the power of the overall wireless system. For systems that run on batteries, a power amplifier with a low efficiency ($P_{out}/P_{supply}$) results in a reduced communication time for a given battery life. A decrease in efficiency of the power amplifier typically results in increased power usage and heat removal requirements, which may increase the equipment and operating costs of the overall system.

For this reason, much effort has been expended on increasing the efficiency of RF power amplifiers.

A class AB amplifier, that is an amplifier with amplifying device(s) biased in class AB is typically considered the standard against which other amplifier architectures are compared in terms of gain and efficiency.

One type of amplifier that may increase power amplifier efficiency is a Doherty-type power amplifier. A common Doherty-type power amplifier design includes a main amplifier and an auxiliary amplifier. The main amplifier is operated to maintain optimal efficiency up to a certain power level and allows the auxiliary amplifier to operate above that level. When the power amplifier is operated at a high output power level, the gain of the main amplifier will be heavily compressed such that non-linearities are introduced into the amplified signal.

In a conventional Doherty-type amplifier, a signal preparation unit, often implemented with a simple power splitting structure, is used to divide an amplifier input signal along main and auxiliary amplification paths to the main and auxiliary amplifiers, respectively, for amplification.

FIG. 1 is a block diagram of a conventional Doherty-type amplification unit 100. As shown in FIG. 1, Doherty-type amplification unit 100 comprises an input signal line 106, a main amplifier 102, an auxiliary amplifier 104, a signal preparation unit 110, a main amplifier impedance transformer 112, and an output signal line 108. An input signal is passed into input signal line 106 and into signal preparation unit 110. Signal preparation unit 110 transmits the input signal from input signal line 106 into main amplifier 102, and signal preparation unit 110 phase shifts the input signal from input signal line 106 and transmits the phase shifted signal to auxiliary amplifier 104. A combining structure 114, which includes the main amplifier impedance transformer 112 in the main amplifier signal path at the output of the main amplifier 102, receives output from the main amplifier 102 and output from the auxiliary amplifier 104 and combines them to form an output signal that is transmitted to signal output line 108.

In some conventional Doherty-type amplifiers, the phase shift introduced by signal preparation unit 110 is corrected in main amplifier impedance transformer 112, so that the signal exiting main amplifier impedance transformer 112 is in phase with the signal that exits auxiliary amplifier 104.

In many conventional Doherty-type amplifiers, a matching structure (not shown in FIG. 1) is used to match the output impedance of the Main and Auxiliary amplifiers to the input impedance of the device that is being driven by the output of the Doherty-type amplifier, typically an antenna structure.

Although Doherty-type amplifiers are often superior in terms of efficiency over Class AB amplifiers, they are often plagued by reduced gain levels. Typical Doherty-type amplifier designs (Classical, Asymmetrical and Enhanced asymmetrical) generally incorporate a power divider that either separates the input signal power equally, or in a pre-set ratio, to the Main and Auxiliary amplifier paths. However, the portion of the input signal that is directed to the Auxiliary amplifier path is typically used to self-bias the Auxiliary amplifier in back-off and therefore does not develop measurable power at the output of the Auxiliary amplifier since the Auxiliary amplifier is typically off during back-off operation thereby reducing the overall gain of the conventional Doherty-type amplifier. In other words, the portion of the input signal that is directed to the Auxiliary amplifier in a conventional Doherty-type amplifier is not amplified during back-off operation thereby lowering the overall gain.

FIG. 2 is a plot of gain and efficiency versus output power for a conventional AB amplifier at 200, 202 respectively and a plot of gain and efficiency versus output power for a conventional Doherty-type amplifier at 206, 204 respectively. It can be seen from FIG. 2 that efficiency 200 of the class AB amplifier is much poorer than the efficiency 204 of the conventional Doherty-type amplifier. However, the gain 202 of the class AB amplifier is almost 4 dB higher than the gain 206 of the conventional Doherty-type amplifier.

In order to increase the gain of a conventional Doherty-type amplifiers, larger drive circuitry, i.e., larger Main and Auxiliary path drivers (or amplifiers prior to the Signal Preparation Unit, 110) that consume more power, are typically used, which quickly reduces the efficiency improvements achieved through use of the Doherty architecture.

In common Doherty-type amplifiers, the main and auxiliary amplifiers are composed of the same type of amplifiers with the same power amplification rating. These Doherty-type amplifiers develop an efficiency peak 6 dB back of full power which in theory will be equal in magnitude to the maximum efficiency of the system.

In asymmetrical Doherty-type amplifiers, the main and auxiliary amplifiers are implemented with devices of unequal size in terms of power. Accordingly, traditional Doherty characteristics, specifically efficiency versus output power, can be modified in order to adjust the location of the peak efficiency in back-off.

A further advance over asymmetrical Doherty-type amplifiers is provided in an enhanced asymmetrical Doherty-type amplifier, as described in U.S. Patent Application Publication No. US 2008/0088369, published Apr. 17, 2008, which is assigned to the Assignee of this application, and is hereby incorporated by reference in its entirety. An enhanced asymmetrical Doherty-type amplifier utilizes an asymmetrical Doherty-type amplifier structure with Main and Auxiliary amplifier devices of different semiconductor technologies to take advantage of the performance characteristics, for example, linearity and power handling characteristics, of the different semiconductor technologies.

With enhanced asymmetrical Doherty-type amplifiers, relatively high efficiency can be tailored to a given output power transfer function with different sizes, in terms of power, for the Main and Auxiliary amplifiers, as well as the use of different semiconductor technologies to implement the Main and Auxiliary amplifiers. In some implementations, various classes of device biasing are used to bias the devices used to implement the Main and Auxiliary amplifiers. Examples of potential device biasing classes include, but are not limited to, Class A, AB, B, C, D and H.

An amplifier device biased in class A conducts current at all times, Class B amplifiers are designed to amplify half of an input wave signal, and Class AB is intended to refer to the Class of amplifier which combines the Class A and Class B amplifier. As a result of the Class B properties, Class AB amplifiers are operated in a non-linear region that is only linear over half the wave form. Class C amplifiers are biased well beyond cut-off, so that current, and consequently the input signal, is amplified less than one half the duration of any given period. The Class C design provides higher power-efficiency than Class B operation but with the penalty of higher input-to-output nonlinearity.

Furthermore, these types of amplifiers are high in memory, i.e., previous operating states effect the current state, and therefore are difficult to "correct" or "linearize", due to their complex gain and phase profiles.

Asymmetrical Doherty-type amplifiers are even more difficult to linearize as the typically smaller Main amplifier is pushed deeper into compression before the Auxiliary amplifier turns on to handle the higher input power levels.

Enhanced asymmetrical Doherty-type amplifiers are again more difficult to linearize due to the asymmetrical transfer functions, specifically in terms of gain and phase, which the mixed semiconductor devices introduce.

Conventional pre-distortion algorithms typically cannot provide sufficient correction of asymmetrical and/or enhanced asymmetrical Doherty-type amplifiers such that they comply with transmission standards such as CDMA, UMTS, HSPA, OFDM, WiMAX, LTE and multicarrier GSM. Consequently, unlinearized enhanced asymmetrical Doherty amplifiers are generally unsuitable for linear modulation systems.

In addition to the gain and linearization issues, conventional Doherty-type amplifiers typically only operate over a narrow frequency band, which is typically limited by the Doherty combining and matching structures utilized to combine the outputs of the main and auxiliary amplifier paths and match the outputs of the main and auxiliary amplifiers to a load impedance. Accordingly, conventional Doherty-type amplifiers are typically limited to narrow band applications.

SUMMARY OF THE INVENTION

According to one broad aspect of the present invention, there is provided an amplifier arrangement for amplifying an amplifier arrangement input, the amplifier comprising: a main amplifier path comprising a main amplifier; an auxiliary amplifier path comprising an auxiliary amplifier; a combining structure configured to combine outputs of the main and auxiliary amplifiers; and a signal preparation unit configured to develop a main amplifier input signal for the main amplifier path and an auxiliary amplifier input signal for the auxiliary amplifier path as a function of the amplifier arrangement input and a transition threshold associated with the amplifier arrangement input.

In some embodiments, the amplifier arrangement further comprises a bias controller configured to bias the auxiliary amplifier substantially at but below a turn-on voltage of the auxiliary amplifier.

In some embodiments, the signal preparation unit is configured to: develop the main amplifier input signal with substantially all of the amplifier arrangement input for voltages of the amplifier arrangement input that are below the transition threshold; and redirect at least some portion of the amplifier arrangement input to develop the auxiliary amplifier input signal for voltages of the amplifier arrangement input that are above the transition threshold.

In some embodiments, the transition threshold is substantially equal to the 1 dB compression point (P1 dB) of the main amplifier.

In some embodiments, the signal preparation unit is configured to asymmetrically divide the amplifier arrangement input above the transition threshold between the main amplifier input signal and the auxiliary amplifier input signal.

In some embodiments, the signal preparation unit is configured to asymmetrically divide the amplifier arrangement input above the transition threshold based on a ratio between maximum power ratings of the main amplifier and the auxiliary amplifier.

In some embodiments, the amplifier arrangement further comprises: a plurality of auxiliary amplifier paths each comprising a respective auxiliary amplifier, inclusive of the first recited auxiliary amplifier path comprising the first recited auxiliary amplifier, wherein the signal preparation unit is configured to develop the main amplifier input signal for the main amplifier path and a respective auxiliary amplifier input signal for each one of the plurality of auxiliary amplifier paths, inclusive of the first recited auxiliary amplifier input signal for the first recited auxiliary amplifier path, based on a plurality of transition thresholds inclusive of the first recited transition threshold.

In some embodiments: electrical length of the auxiliary amplifier path after the auxiliary amplifier is substantially equal to N×180°, where N is an integer; and electrical length of the main amplifier path after the main amplifier is 90° longer than the electrical length of the auxiliary amplifier path after the auxiliary amplifier.

In some embodiments, the amplifier arrangement further comprises a matching structure configured to substantially match the outputs of the main and auxiliary amplifiers to a desired load impedance.

In some embodiments: the combining structure forms part of the main and auxiliary amplifier paths and comprises a quarter wave transformer configured to provide the additional 90° electrical length in the main amplifier path after the main amplifier relative to the auxiliary amplifier path after the auxiliary amplifier; and the quarter wave transformer comprises any one of: a microstrip; and a shorted stub.

In some embodiments, the main amplifier and the auxiliary amplifier are asymmetrically sized in terms of maximum power ratings.

In some embodiments, the main amplifier and the auxiliary amplifier are fabricated from different semiconductor materials.

In some embodiments, the main amplifier and the auxiliary amplifier are provided in a common package to minimize the electrical lengths of the main and auxiliary amplifier paths.

In some embodiments, the combining structure is provided in the common package to minimize the electrical length of the combining structure.

According to another broad aspect of the present invention, there is provided a method for controlling a Doherty amplifier comprising a main amplifier and an auxiliary amplifier, the method comprising: developing a main amplifier input signal for the main amplifier and an auxiliary amplifier input signal for the auxiliary amplifier as a function of an amplifier input that is to be amplified and a transition threshold associated with the amplifier input.

In some embodiments, the method further comprises biasing the auxiliary amplifier substantially at but below a turn-on voltage of the auxiliary amplifier.

In some embodiments, developing the main amplifier input signal and the auxiliary amplifier input signal comprises: for voltages of the amplifier input that are below the transition threshold, developing the main amplifier input signal with substantially all of the amplifier input; and for voltages of the amplifier input that are above the transition threshold, redirecting at least some portion of the amplifier input to develop the at least one auxiliary amplifier input signal.

In some embodiments, the transition threshold is substantially equal to the 1 dB compression point (P1 dB) of the main amplifier.

In some embodiments, redirecting at least some portion of the amplifier input comprises: asymmetrically dividing the amplifier input above the transition threshold between the main amplifier input signal and the auxiliary amplifier input signal.

In some embodiments, asymmetrically dividing the amplifier input above the transition threshold comprises dividing the amplifier input based on a ratio between maximum power ratings of the main amplifier and the auxiliary amplifier.

Other aspects and features of the present invention will become apparent, to those ordinarily skilled in the art, upon review of the following description of the specific embodiments of the invention.

BRIEF DESCRIPTION OF THE DRAWINGS

Embodiments of the invention will now be described in greater detail with reference to the accompanying drawings, in which:

FIG. 12B is a Smith chart plot of the simulated s-parameter s11 for the improvised Doherty combining structure of FIG. 12A;

FIGS. 13A and 13B are schematic diagrams of Doherty-type amplifiers with different Doherty combining structures in accordance with embodiments of the present invention;

DETAILED DESCRIPTION

In the following detailed description of sample embodiments, reference is made to the accompanying drawings, which form a part hereof, and in which is shown by way of illustration specific sample embodiments in which the present invention may be practised. These embodiments are described in sufficient detail to enable those skilled in the art to practice the invention, and it is to be understood that other embodiments may be utilized and that logical, mechanical, electrical, and other changes may be made without departing from the scope of the invention. The following detailed description is, therefore, not to be taken in a limiting sense, and the scope is defined by the appended claims.

Various architectures and methods relating to amplifiers having a Doherty-type architecture, that is an amplifier architecture featuring a main amplification path and one or more auxiliary amplification paths in parallel with the main amplification path, are provided.

Increased gain for Doherty-type amplifier architectures is potentially achieved in some embodiments of the present invention by controlling the input drive signals provided to the main and auxiliary amplifier paths such that substantially all of the power in an input signal that is to be amplified is directed to the main amplifier path up to a transition threshold, after which a post-transition threshold power division strategy is employed to control division of the input signal between the main and auxiliary amplifier paths. A bias value for the auxiliary amplifier(s) in the auxiliary amplifier path may be selected to control when the auxiliary amplifier(s) turn-on in relation to the threshold.

Details of how input signal preparation, auxiliary amplifier biasing, transition threshold selection and post-transition threshold power division may be determined are provided below by way of example with reference to specific embodiments. The specific embodiments discussed below are provided for illustrative purposes only and should not be construed as limiting as to the broader aspects of the present disclosure.

Figure 3:
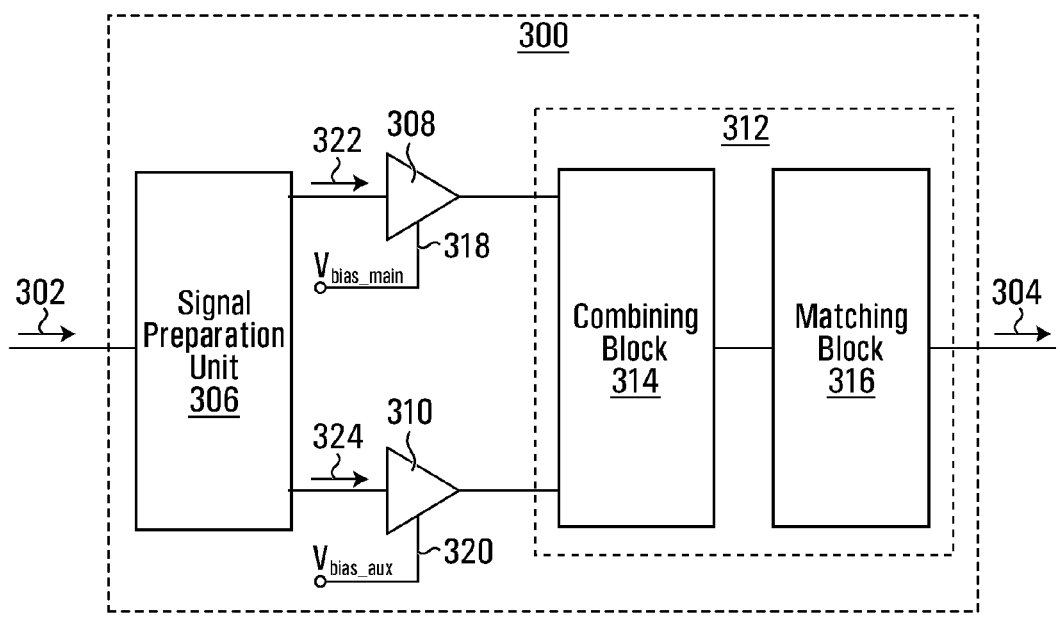
FIG. 3 is a block diagram of a Doherty-type amplifier according to an embodiment of the invention.

FIG. 3 is a block diagram of a Doherty-type amplifier arrangement 300 in accordance with an embodiment of the present invention. The Doherty-type amplifier arrangement 300 includes a signal preparation unit 306, main and auxiliary amplifier paths that include a main amplifier 308 and an auxiliary amplifier 310, respectively and an output signal combiner 312 that is operatively connected to outputs of the main and auxiliary amplifiers 308, 310.

The main and auxiliary amplifiers 308, 310 each have a bias control input through which a bias voltage Vbias_main 318 and Vbias_aux 320, respectively can be set. Details of the selection of the bias voltages Vbias_main 318 and Vbias_aux 320 that might be used for some embodiments of the present invention are discussed below with reference to FIG. 4.

In some embodiments, the amplifier arrangement 300 includes a bias controller (not shown) that controls the biasing of the main and auxiliary amplifiers.

In operation, the signal preparation unit 306 develops main and auxiliary amplifier path input signals 322, 324 that it drives to the main and auxiliary amplifiers 308, 310 respectively based on an amplifier input signal 302 received at an input of the signal preparation unit and a transition threshold. Details of how the input signal preparation unit 306 develops main and auxiliary amplifier path input signals 322, 324 based on the input signal 302 and a transition threshold are discussed in detail below with reference to FIGS. 5 to 10.

The output signal combiner 312 combines outputs of the main and auxiliary amplifiers 308, 310 resulting in an amplified output signal 304.

In some embodiments, the output signal combiner 312 includes a combining block 314 that combines the outputs of main and auxiliary amplifiers 308, 310 and a matching block 316 that is intended to substantially match the combined output impedance of the combining block to an input impedance of another element. In the context of a wireless transmitter, the next element in the transmitter following a power amplifier, such as the Doherty-type amplifier arrangement 300 shown in FIG. 3, is typically an isolator, filter, duplexer or antenna. Accordingly, in some embodiments, the matching block 316 is intended to substantially match an output impedance of the combining block 314 with the input impedance of one of those elements (not shown). While the output signal combiner 312 shown in FIG. 3 includes separate combining and matching blocks 314 and 316, in some embodiments some elements, such as a quarter wave transformer in the output path of the main amplifier 308, may serve as both a combining and a matching element.

In some embodiments, the main amplifier 308 and/or the auxiliary amplifier 310 include their own matching structures so that the semiconductor structures used to realize the main and auxiliary amplifiers are presented with desired target impedances.

While the Doherty-type amplifier 300 shown in FIG. 3 only includes a single auxiliary amplifier path with a single auxiliary amplifier, more generally a Doherty-type amplifier arrangement in accordance with an embodiment of the present invention may include any number of auxiliary amplifier paths each having a respective auxiliary amplifier.

For embodiments with multiple auxiliary amplifier paths, the signal preparation unit may develop the amplifier input signals for each of the amplifier paths based on multiple transition thresholds utilizing asymmetric post-transition threshold power division as described herein, such that successive auxiliary amplifier paths receive some portion of the input signal power as the input signal power transitions through their corresponding transition thresholds. The use of transition thresholds in developing main and auxiliary amplifier input signals and post-transition threshold power division strategies are discussed in further detail below with reference to single auxiliary amplifier path embodiments. However, it should be understood that those features are extendable to embodiments that include more than one auxiliary amplifier path.

Furthermore, it should be understood that although the main amplifier 308 and the auxiliary amplifier 310 are shown as individual amplifier elements in FIG. 3, more generally the main amplifier and the auxiliary amplifier may include any number of amplifiers arranged in successive gain stages.

Selection of the biasing class of the auxiliary amplifier 310 will now be described with reference to FIGS. 4A to 4C, which illustrate plots of overall gain and efficiency versus output signal power of a Doherty-type amplifier arrangement in accordance with an embodiment of the present invention for three different auxiliary amplifier bias settings.

Figure 4A:
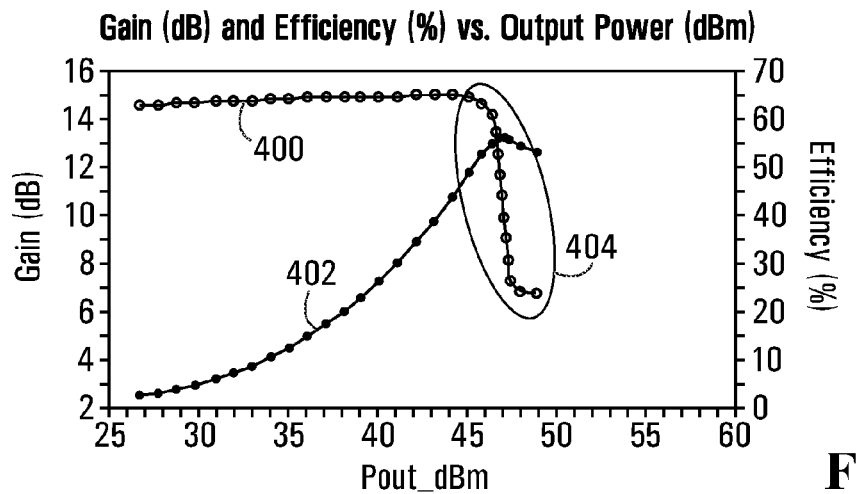
FIG. 4A is a plot of simulated gain and efficiency for a Doherty-type amplifier with an auxiliary amplifier biased in class C according to an embodiment of the present invention.

FIG. 4A shows exemplary gain 400 and efficiency 402 curves for a Doherty-type amplifier in accordance with an embodiment of the present invention in which the auxiliary amplifier is biased in class C. As illustrated in region 404 of the FIG. 4, class C biasing of the auxiliary amplifier causes a lag before the auxiliary amplifier begins to add to the output power. This is because in class C biasing, the auxiliary amplifier is biased such that it is turned-off until the auxiliary amplifier path input signal 324 is strong enough to turn on the auxiliary amplifier, which causes a drop-off in the gain as the portion of the power of the input signal 302 that is diverted to develop the auxiliary amplifier input signal 324 is not amplified until the auxiliary amplifier is turned on. Biasing the auxiliary amplifier in class C typically results in a system that is heavily compressed. Furthermore, when biased in Class C the auxiliary amplifier 310 demands higher drive levels, as compared to biasing in class AB or class B, before the auxiliary amplifier contributes to the overall gain of the Doherty amplifier.

Figure 4B:
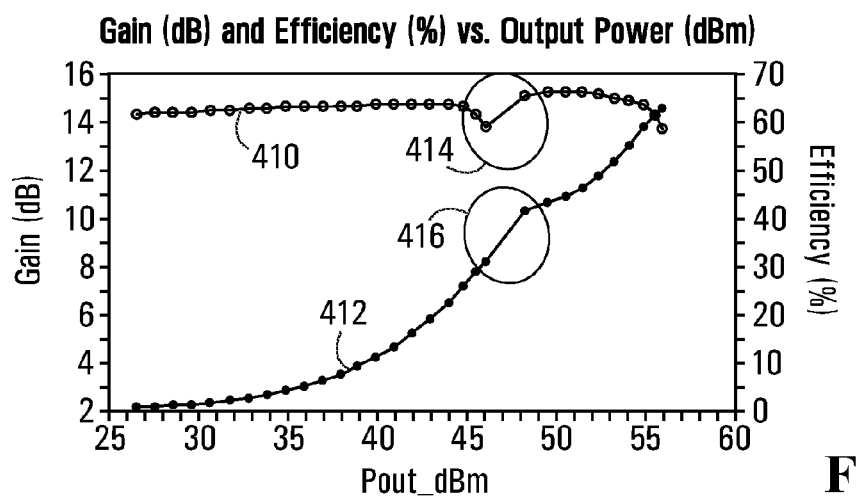
FIG. 4B is a plot of simulated gain and efficiency for a Doherty-type amplifier with an auxiliary amplifier biased in class AB according to an embodiment of the present invention.
Figure 4C:
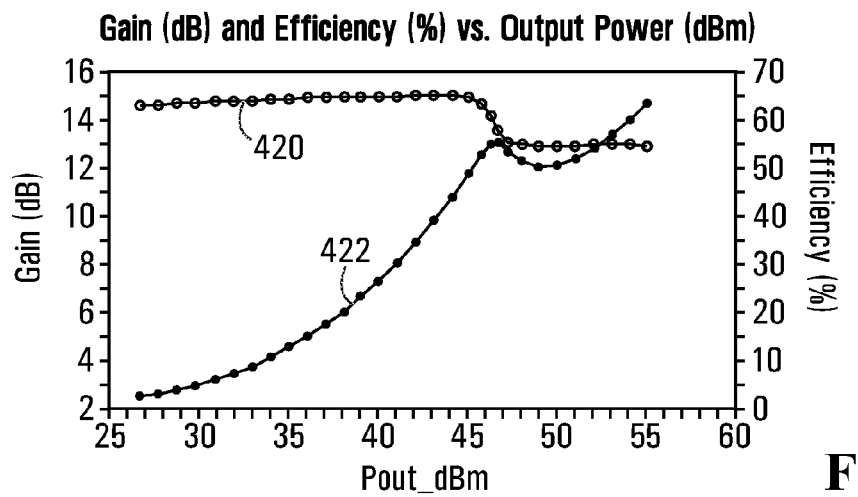
FIG. 4C is a plot of simulated gain and efficiency for a Doherty-type amplifier with an auxiliary amplifier biased in class B according to an embodiment of the present invention.

FIG. 4B shows exemplary gain 410 and efficiency 412 curves for a Doherty-type amplifier in accordance with an embodiment of the present invention in which the auxiliary amplifier is biased in class AB. When biased in class AB, the auxiliary amplifier provides amplified output as soon as any auxiliary amplifier input signal 324 is provided to it. This causes discontinuities in the gain and efficiency curves 410, 412, which can be seen in regions 414 and 416 of FIG. 4B. These discontinuities can make it difficult for pre-distortion algorithms to linearize Doherty-type amplifiers with auxiliary amplifiers biased in class AB. However, biasing the auxiliary amplifier in class AB can potentially increase the efficiency at higher output power levels, as shown in FIG. 4B FIG. 4C shows exemplary gain 420 and efficiency 422 curves for a Doherty-type amplifier in accordance with an embodiment of the present invention in which the auxiliary amplifier is biased in class B. In Class B, the auxiliary amplifier is biased substantially at or near its turn-on voltage, so that the lag present in class C biasing is substantially eliminated, as the auxiliary amplifier substantially immediately provides unity gain (0 dB). Additionally, the discontinuity in the gain and efficiency with class AB biasing is substantially eliminated with class B biasing, as an auxiliary amplifier biased in class B transitions from unity gain (0 dB) to its maximum gain in a continuous manner. This can potentially make a Doherty-type amplifier with an auxiliary amplifier biased in class B easier to linearize than one in which the auxiliary amplifier is biased in class AB.

With further reference to FIG. 3, the biasing class of the auxiliary amplifier, which is controlled by the auxiliary amplifier bias control voltage Vbias_aux 320, determines how the auxiliary amplifier responds to the auxiliary amplifier input signal 324 provided by the input signal splitter 306. The operation of the signal preparation unit 306 in providing the main and auxiliary amplifier input signals 322 and 324, respectively, from the input signal 302 will now be described, by way of example, with reference to FIGS. 6 to 10.

Figure 1:
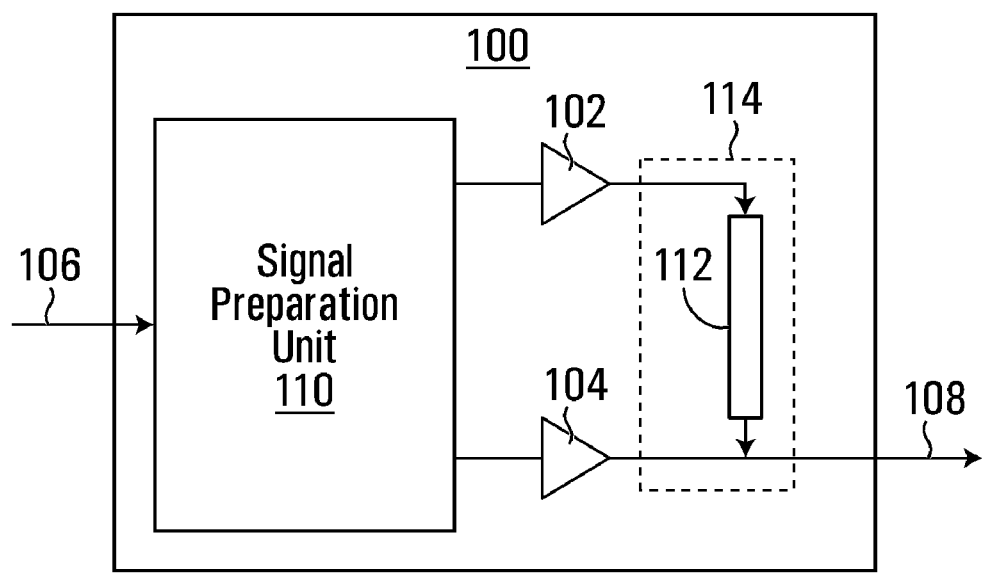
FIG. 1 is a block diagram of a known Doherty-type amplification unit.
Figure 2:
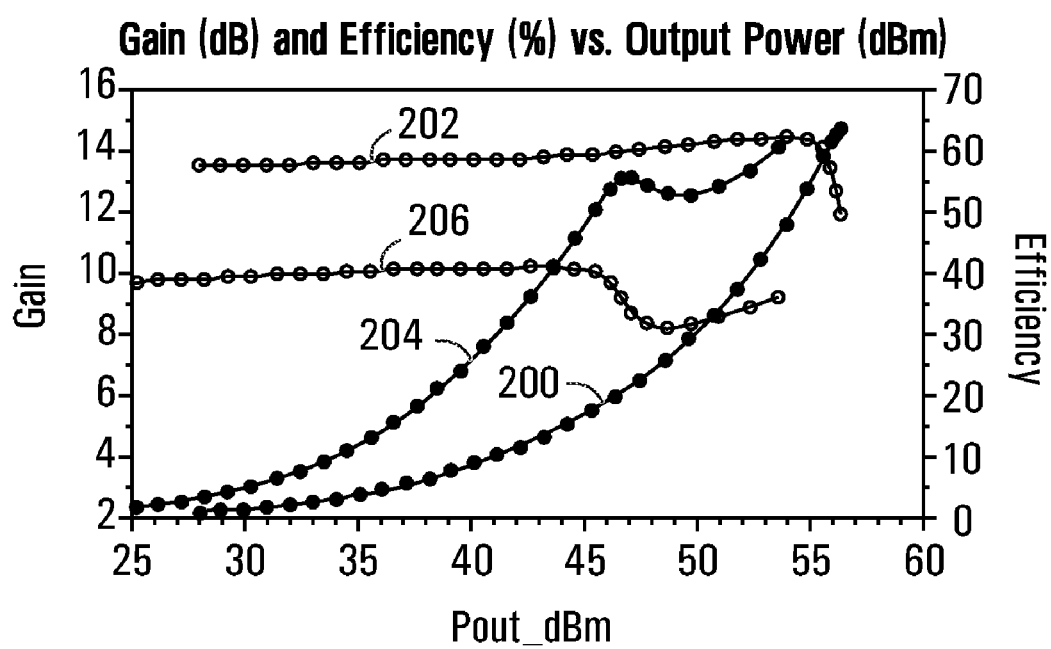
FIG. 2 is a plot of gain and efficiency versus output power for a conventional class AB amplifier and a conventional Doherty-type amplifier.

Many conventional Doherty-type amplifiers include a signal preparation unit that uses symmetrical power division to develop input signals for main and auxiliary amplifier. For example, referring to FIG. 1 again, the conventional signal preparation unit 110 may symmetrically divide the power of the input signal 106 between the main and auxiliary amplifier paths to develop the main and auxiliary amplifier input signals to the main and auxiliary amplifiers 102 and 104 such that the main amplifier 102 and the auxiliary amplifier 104 are driven equally.

Figures 8A, 8B:
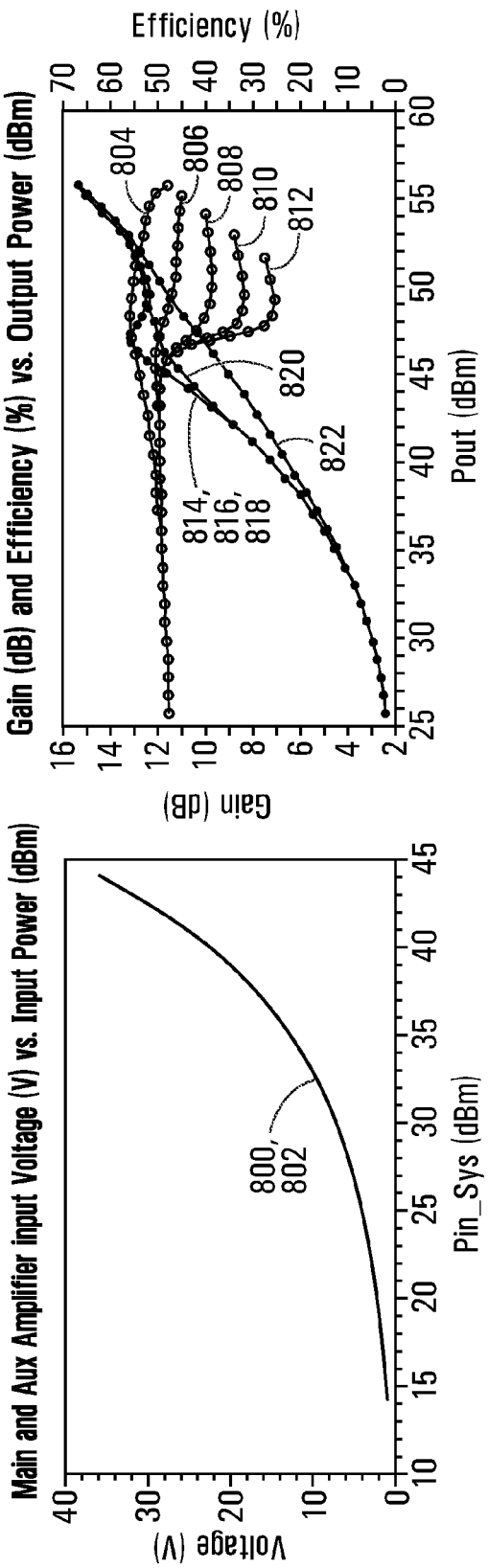
FIG. 8A is a plot of transfer functions relating main and auxiliary amplifier input signal voltages to input power resulting in equal main and auxiliary amplifier input signals in a known asymmetric Doherty-type amplifier.
FIG. 8B is a plot of the simulated gain and efficiency for various auxiliary bias voltage in a Doherty-type amplifier driven with equal main and auxiliary amplifier input signals generated according to the transfer functions shown in FIG. 8A.

FIG. 8A is a plot of transfer functions 800 and 802 relating main and auxiliary amplifier input signal voltages, respectively, to the input power of a Doherty-type amplifier. The transfer functions 800 and 802 result in equal/symmetric main and auxiliary amplifier input signals. FIG. 8B is a plot of gain curves 804, 806, 808, 810 and 812 and efficiency curves 814, 816, 818, 820 and 822 versus amplifier output power for a Doherty-type amplifier with symmetric main and auxiliary amplifier input signals generated according to the transfer functions 800 and 802 illustrated in FIG. 8A. Each gain and efficiency curve pair 804 and 814, 806 and 816, 808 and 818, 810 and 820, and 812 and 822, corresponds to a different auxiliary amplifier bias voltage.

As can be seen in FIG. 8B, when symmetrical power division is used to develop main and auxiliary amplifier input signals, the efficiency curves 820 and 822 for lower auxiliary amplifier bias voltages (more towards class C biasing of the auxiliary amplifier) are lower than the efficiency curves 814, 816 and 818 for higher auxiliary amplifier bias voltages (more towards class B biasing of the auxiliary amplifier).

Figures 9A, 9B:
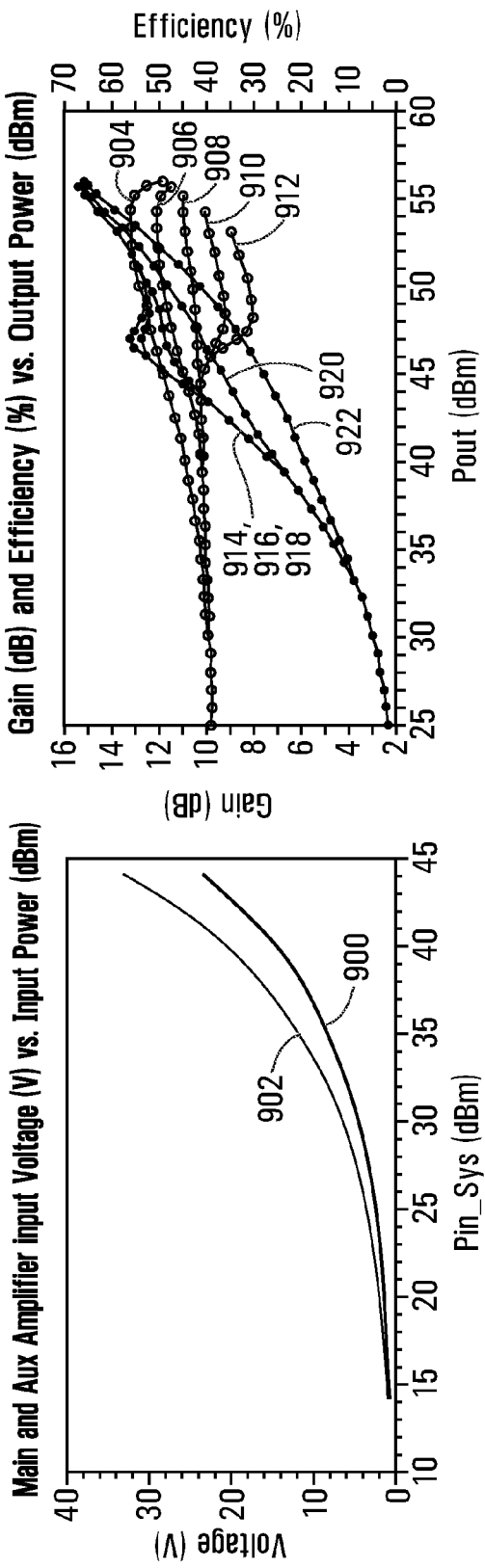
FIG. 9A is a plot of transfer functions relating main and auxiliary amplifier input signal voltages to input power resulting in unequal main and auxiliary amplifier input signals in a known asymmetric Doherty-type amplifier.
FIG. 9B is a plot of the simulated gain and efficiency for various auxiliary bias voltages in a Doherty-type amplifier driven with unequal main and auxiliary amplifier input signals generated according to the transfer functions shown in FIG. 9A.

In some conventional Doherty-type amplifiers, asymmetric power division may be used to develop the main and auxiliary amplifier input signals by asymmetrically dividing the power of an input signal between the main and auxiliary amplifier paths. FIG. 9A is a plot of transfer functions 900 and 902 relating main and auxiliary amplifier input signal voltages, respectively, to the input signal power of a Doherty-type amplifier, which result in unequal/asymmetric main and auxiliary amplifier input signals. The asymmetric power division implemented by the transfer functions 900 and 902 of FIG. 9A are such that the auxiliary amplifier input signal receives a greater percentage of the power of the input signal than the main amplifier input signal for all input signal power levels.

FIG. 9B is a plot of gain curves 904, 906, 908, 910 and 912 and efficiency curves 914, 916, 918, 920 and 922 versus amplifier output power for a conventional Doherty-type amplifier with asymmetric input signal power division according to the transfer functions 900 and 902 illustrated in FIG. 9A. As can be seen in FIG. 9B, for conventional asymmetrical power division of an input signal between main and auxiliary amplifiers, the efficiency curves 920 and 922 for lower auxiliary amplifier bias voltages are lower than the efficiency curves 914, 916 and 918 for higher auxiliary amplifier bias voltages, which, like the symmetrical power division results illustrated in FIG. 8B, indicates that the biasing of the auxiliary amplifier impacts the efficiency of a Doherty-type amplifier operating with asymmetric or symmetric power division. However, it is noted that although the peak gain (approx. 10 dB) of the gain curves 904, 906, 908, 910 and 912 for asymmetric power division is lower than the peak gain (approx. 12 dB) of the gain curves 804, 806, 808, 810 and 812 for symmetric power division, the gain curves 904, 906, 908, 910 and 912 for asymmetric power division appear to be more linear than the corresponding gain curves 804, 806, 808, 810 and 812 for symmetric power division.

Referring again to FIG. 3, in contrast to the conventional power division strategies shown in FIGS. 8A and 9A, the signal preparation unit 306 shown in FIG. 3 develops the main and auxiliary amplifier input signals 322 and 324, respectively, based on the input signal 302 and a determination of whether or not the input signal 302 has exceeded a transition threshold.

More specifically, in some embodiments the signal preparation unit 306 develops the main and auxiliary amplifier input signals 322 and 324, respectively, by developing the main amplifier input signal 322 with substantially all of the power of the input signal 302 up to a transition threshold, after which some or all of the additional input signal 302 above the threshold level is used to develop the auxiliary amplifier input signal 324. Effectively, in these embodiments the signal preparation unit can be thought of as a switch that, for input signal levels below the threshold, diverts substantially all of the input signal to the main amplifier 308 and at the transition threshold input signal level begins to divert at least some portion of the input signal to the auxiliary amplifier 310.

Figures 10A, 10B:
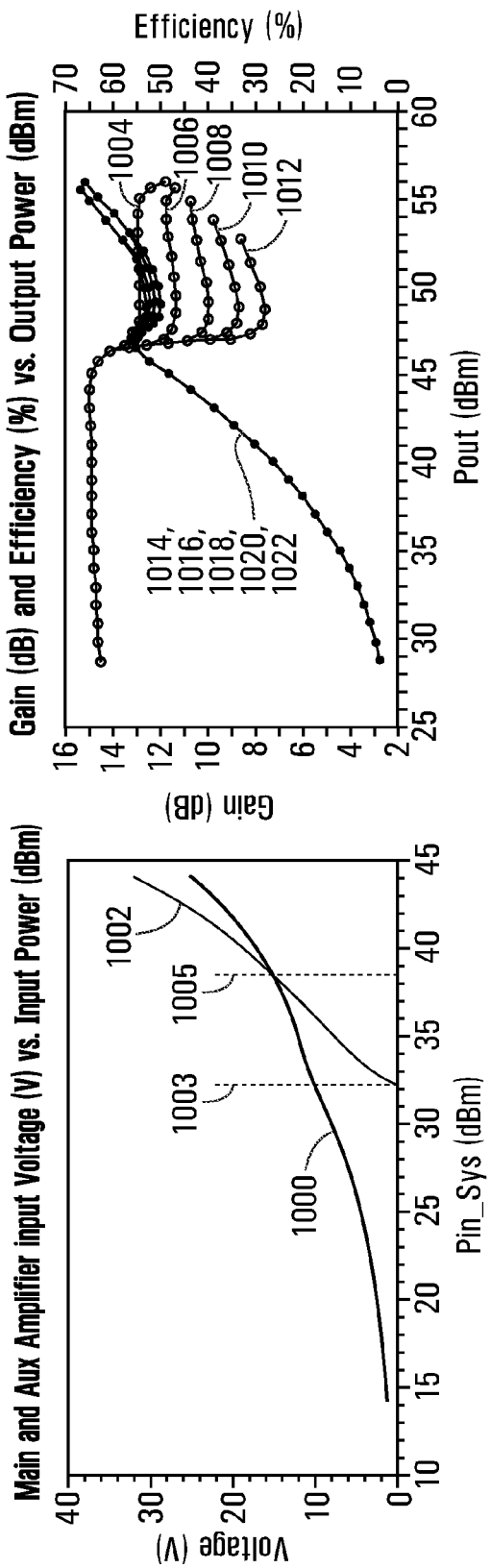
FIG. 10A is a plot of transfer functions relating main and auxiliary amplifier input signals to input power wherein all input power below a transition threshold voltage is directed to the main amplifier input signal and thereafter asymmetric post-transition power division is used according to an embodiment of the present invention.
FIG. 10B is a plot of the simulated gain and efficiency for various auxiliary bias voltages in a Doherty-type amplifier driven with the main and auxiliary amplifier input signals shown in FIG. 10A.

FIG. 10A is a plot of transfer functions 1000 and 1002 relating main and auxiliary amplifier input signal voltages, respectively, to input signal power, that include a transition threshold and utilize asymmetric post-transition threshold power division. In FIG. 10A, for input signal power levels below a threshold power level 1003, the main amplifier input signal is developed with substantially all of the input signal power and after the threshold power level 1003 the additional input signal power is asymmetrically divided between the main amplifier input signal and the auxiliary amplifier input signal such that after the transition threshold power level 1003 the auxiliary amplifier receives a greater percentage of the additional input signal power. This causes the auxiliary amplifier input signal to increase relative to the main amplifier input signal after the transition threshold power level 1003, which causes the plot of main amplifier input signal 1000 and the plot of the auxiliary amplifier input signal 1002 to intersect at an input signal power 1005, after which the auxiliary amplifier input signal is larger than the main amplifier input signal.

In some embodiments, asymmetric post-transition power division is performed such that the input signal power 1005 at which the main amplifier input signal and the auxiliary amplifier input signal are equalized occurs at the 1 dB compression point of the main amplifier.

FIG. 10B is a plot of gain curves 1004, 1006, 1008, 1010 and 1012 and efficiency curves 1014, 1016, 1018, 1020 and 1022 versus amplifier output power for a Doherty-type amplifier with asymmetric post-transition threshold power division according to the transfer functions 1000 and 1002 illustrated in FIG. 10A. As can be seen in FIG. 10B, for asymmetric post-transition threshold power division, the efficiency curves 1004, 1006, 1008, 1010 and 1012 are virtually identical, showing little change in efficiency for different auxiliary bias voltages. Furthermore, this approach results in the gain curves 1014, 1016, 1018, 1020 and 1022 having higher peak gain (approx. 15 dB) compared to the corresponding gain curves illustrated in FIGS. 8B and 9B. In FIG. 10B, the gain curves 1012, 1010, 1008, 1006 and 1004 correspond to increasing levels of auxiliary bias voltage. It is clear from FIG. 10B that the higher the auxiliary bias voltage, the more linear the gain response of the overall Doherty-type amplifier, for example, the gain curve 1004 is more linear than the gain curve 1012.

Post threshold power division between the main and auxiliary amplifiers is discussed in further detail below with reference to FIGS. 5 to 7.

Figure 5A:
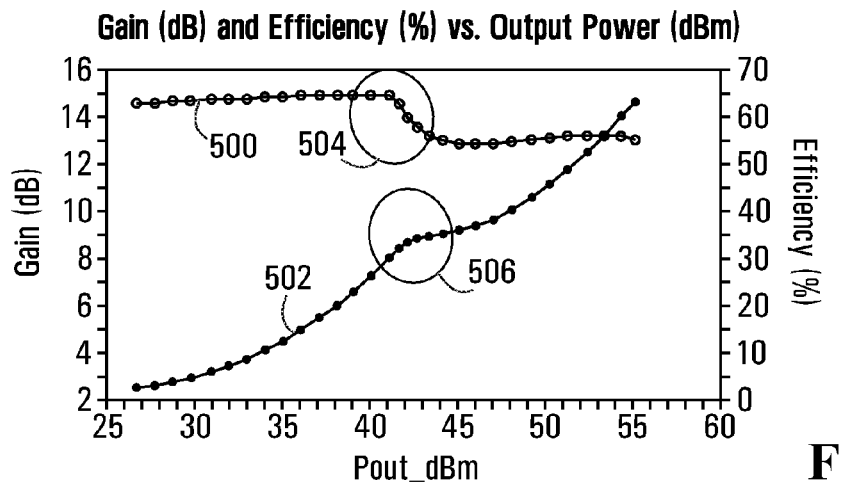
FIG. 5A is a plot of simulated gain and efficiency for a Doherty-type amplifier with a transition threshold set below the 1 dB compression point of the main amplifier according to an embodiment of the present invention.
Figure 5B:
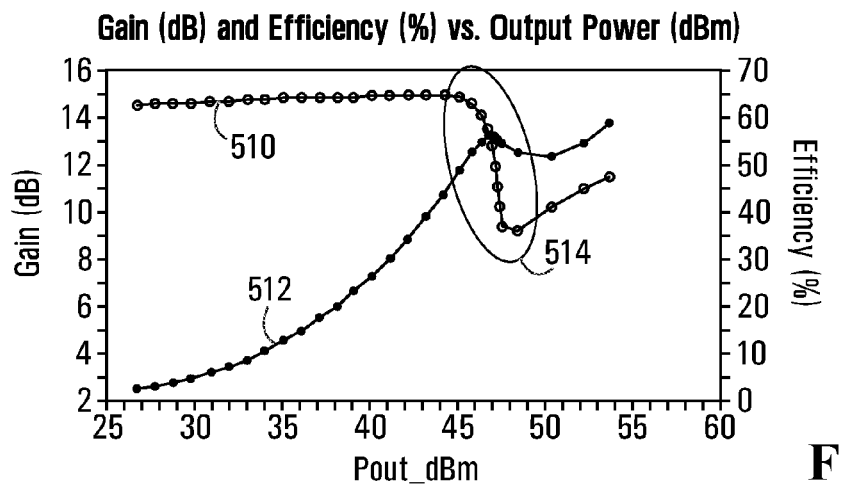
FIG. 5B is a plot of simulated gain and efficiency for a Doherty-type amplifier with a transition threshold set above the 1 dB compression point of the main amplifier according to an embodiment of the present invention.
Figure 5C:
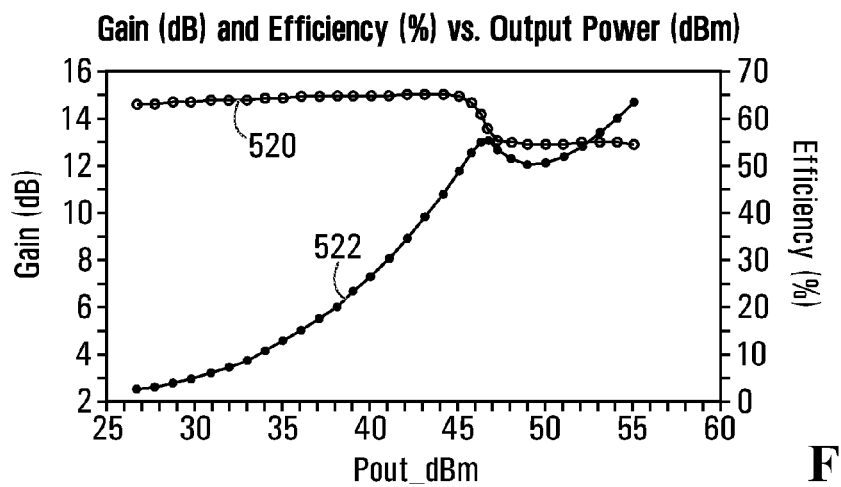
FIG. 5C is a plot of simulated gain and efficiency for a Doherty-type amplifier with a transition threshold set substantially at the 1 dB compression point of the main amplifier according to an embodiment of the present invention.

For a Doherty-type amplifier that utilizes post-transition threshold power division as described herein, selection of the input signal transition threshold relative to the 1 dB compression input voltage, P1 dB, of the main amplifier can potentially impact the linearity and efficiency of the Doherty-type amplifier. FIGS. 5A to 5C are plots of gain and efficiency curves versus output signal power for three different transition thresholds relative to the P1 dB input voltage of the main amplifier of a Doherty-type amplifier in accordance with an embodiment of the present invention in which asymmetric post-transition threshold power division directs a majority of the input signal power above the transition threshold to the auxiliary amplifier (similar to the asymmetric post-transition threshold power division illustrated in FIG. 10A).

FIG. 5A is a plot of a gain curve 500 and an efficiency curve 502 of a Doherty-type amplifier operating with asymmetric post-transition threshold power division similar to the asymmetric post-transition threshold power division illustrated in FIG. 10A, in which the transition threshold is selected to be less than the P1 dB input voltage of the main amplifier of the Doherty-type amplifier. As can be seen from FIG. 5A, when the transition threshold is set to a value that is less than the P1 dB input voltage of the main amplifier and most of the input signal power is directed to the auxiliary amplifier above the transition threshold, the drive of the main amplifier towards compression is terminated prematurely, which means that maximum efficiency in back-off is not achieved. In this embodiment, the drop off, generally indicated at 504, in the gain curve 504 occurs at the transition threshold before the P1 dB of the main amplifier is reached, so that the increasing efficiency that comes with driving the main amplifier towards compression levels off briefly at approximately 35% efficiency, generally indicated at 506, and does not approach 60% efficiency until the output power reaches approximately 55 dBm.

FIG. 5B is a plot of a gain curve 510 and an efficiency curve 512 of a Doherty-type amplifier operating with asymmetric post-transition threshold power division similar to the asymmetric post-transition threshold power division illustrated in FIG. 10A, in which the transition threshold is selected to be greater than the P1 dB input voltage of the main amplifier of the Doherty-type amplifier. As can be seen from FIG. 5B, when the transition threshold is set to a value that is greater than the P1 dB input voltage of the main amplifier, the main amplifier of the Doherty-type amplifier is over-driven such that it experiences excessive compression, generally indicated by the drop off in the gain curve 510 at 514. Essentially, when the transition level is set above the P1 dB compression voltage of the main amplifier, the gain provided by the main amplifier is heavily compressed before any gain contribution from the auxiliary amplifier is realized. Furthermore, because of the heavy compression, i.e., non-linear, performance, of the over-driven main amplifier above its P1 dB input voltage, pre-distortion algorithms will generally have difficulties linearizing a Doherty-type amplifier operated in this mode. However, it should be noted that because the transition threshold is above the P1 dB input voltage of the main amplifier, the drive of the main amplifier towards compression, and hence towards increased efficiency, is not terminated prematurely in this mode.

FIG. 5C is a plot of a gain curve 520 and an efficiency curve 522 of a Doherty-type amplifier operating with asymmetric post-transition threshold power division similar to the asymmetric post-transition threshold power division illustrated in FIG. 10A, in which the transition threshold is selected to be substantially equal to the P1 dB input voltage of the main amplifier of the Doherty-type amplifier. As can be seen from FIG. 5C, when the transition threshold is set to a value that is substantially equal to the P1 dB input voltage of the main amplifier, the main amplifier of the Doherty-type amplifier is driven to a level such that maximum efficiency is achieved. If the majority of the subsequent input drive signal to the Doherty-type amplifier is redirected to the auxiliary amplifier after the transition threshold, the main amplifier is not over-driven, which means that pre-distortion algorithms could potentially more easily linearize a Doherty-type amplifier operated in this mode and the gain curve 520 does not have the steep drop-off generally indicated in the gain curve 510 illustrated in FIG. 5B.

Figure 6A:
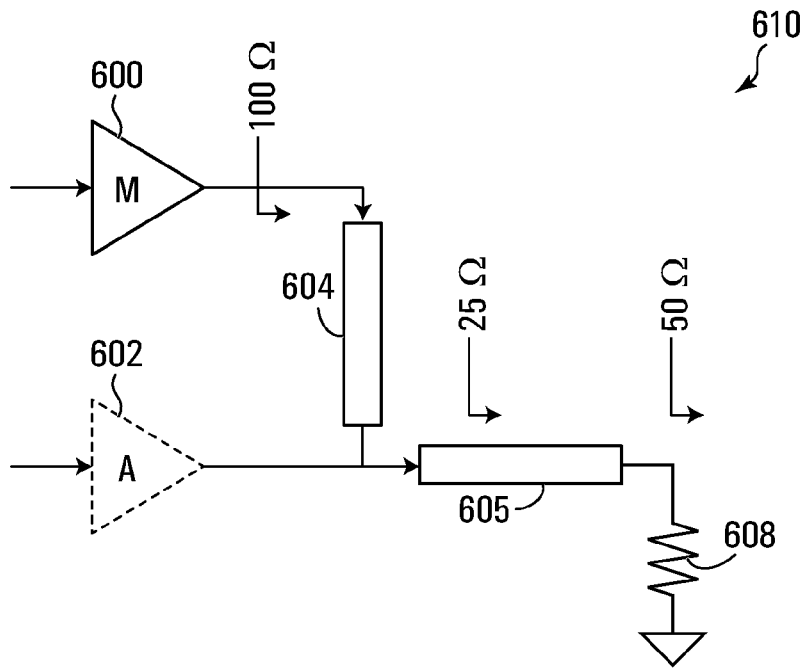
FIGS. 6A and 6B are schematic diagrams of a Doherty-type amplifier with the auxiliary amplifier in an "off" state and in an "on" state, respectively.
Figure 6B:
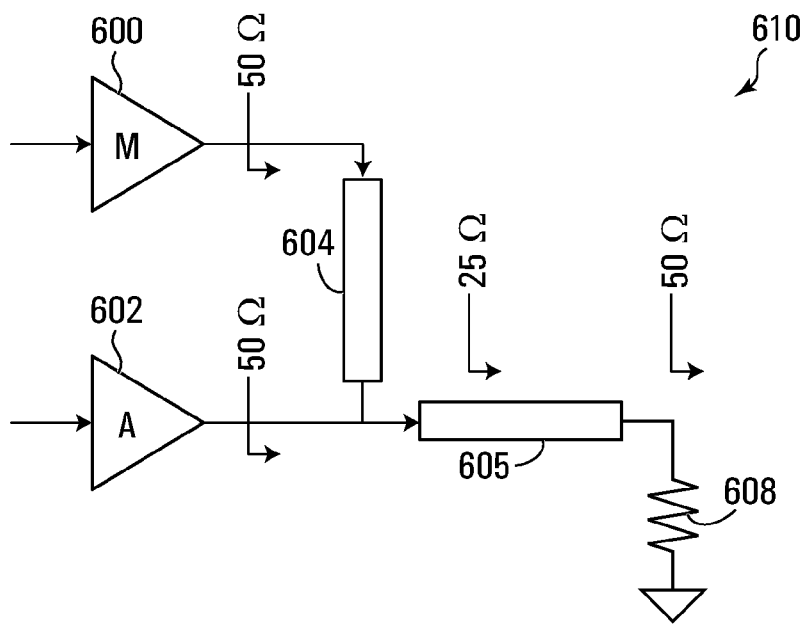
Figure 6C:
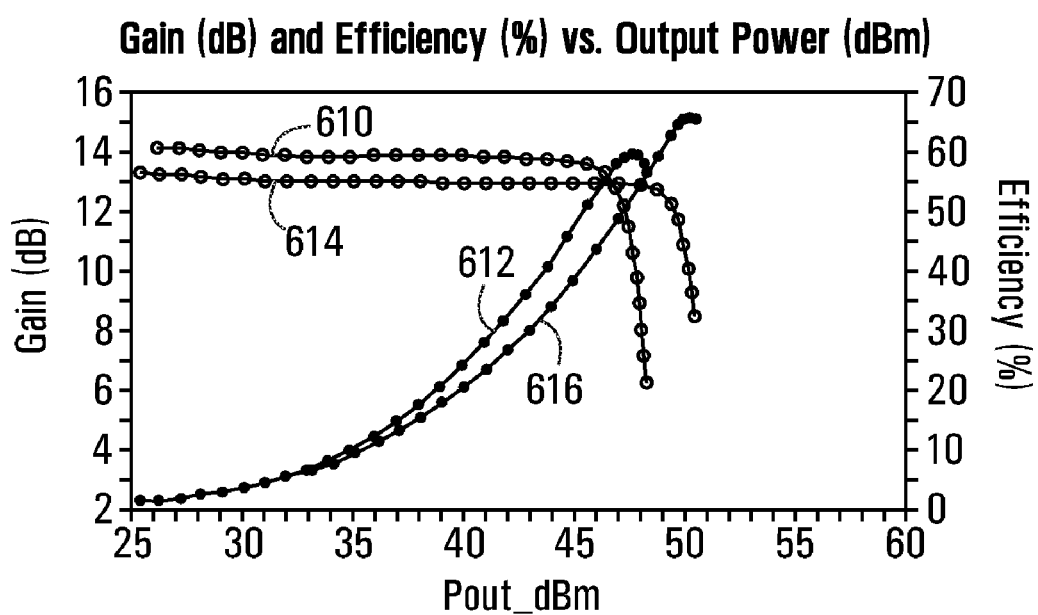
FIG. 6C is a plot of simulated gain and efficiency of an amplifier biased in class AB and presented with two different load impedances corresponding to the load impedances seen by the main amplifier of the Doherty-type amplifier shown in FIGS. 6A and 6B, with the auxiliary amplifier in the "off" state and the "on" state, respectively.

Reference is now made to FIGS. 6A to 6C in order to explain why it may be advantageous to drive at least some of the subsequent input drive signal of the Doherty-type amplifier to the main amplifier above the transition threshold voltage.

FIGS. 6A and 6B are schematic diagrams of a Doherty-type amplifier 610 that illustrate the impedances "seen" by the main and auxiliary amplifiers when the auxiliary amplifier is turned on (FIG. 6A) and turned off (FIG. 6B). The Doherty-type amplifier 610 illustrated in FIGS. 6A and 6B includes a main amplifier 600, and auxiliary amplifier 602, a combining structure 604 that combines outputs of the main and auxiliary amplifiers, and a matching structure 605 that matches the combined output to a load 608. In FIGS. 6A and 6B, the load 608 is a 50 Ohm load and the output matching structure 605 converts the 50 Ohm load to be seen as a 25 Ohm load at the output of the combining structure 604.

In FIGS. 6A and 6B, the Doherty output combining structure 604 is implemented with a simple quarter wave transformer. If the auxiliary amplifier 602 is biased in Class B, as described herein, then it will present an open circuit, i.e., high impedance, to the Doherty output combiner structure 604 when no signal is applied to the input of the auxiliary amplifier. This mode is illustrated in FIG. 6A, in which the auxiliary amplifier 602 presents an effective open circuit to the output of the combining structure 604. The Doherty output combining structure 604 is implemented with a simple quarter wave transformer, which in the mode of operation shown in FIG. 6A transforms the 25 Ohm output impedance of the combining structure such that 100 Ohm is presented to the main amplifier output.

However, with the auxiliary amplifier 602 biased in class B, as soon as any signal is applied to the auxiliary amplifier input the auxiliary amplifier is turned on and the open circuit condition is removed, which means that 50 Ohm is presented to both the main and auxiliary amplifier outputs and the quarter-wave transformer 604 simply ensures that the main and auxiliary amplifier output signals combine in phase. Effectively, this means that once some portion of an input drive signal of the Doherty-type amplifier 610 is driven to the auxiliary amplifier 602, for example, at the transition threshold described herein, and the auxiliary amplifier no longer presents an open circuit at its output, the output impedance presented to the main amplifier 600 drops from 100 Ohm pre-transition to 50 Ohm post-transition.

FIG. 6C is a plot of two pairs of gain curves 610 and 614 and efficiency curves 612 and 616 for an amplifier, such as the main amplifier 600 shown in FIGS. 6A and 6B, presented with 100 Ohm and 50 Ohm load conditions, respectively. It should be noted that the P1 dB input voltage of the amplifier under a 50 Ohm load condition is approximately 3 dB greater than when terminated with 100 Ohm. This can clearly be seen in FIG. 6C, as the gain curve 610 drops off, i.e., compresses, at an output voltage that is approximately 3 dB less than the gain curve 614 and the efficiency curve 616 has a peak at an output power that is approximately 3 dB higher than the output power at which the efficiency curve 612 peaks.

Accordingly, since the P1 dB compression point of the main amplifier in a Doherty-type amplifier will increase by approximately 3 dB after some input signal is redirected to the auxiliary amplifier at the transition threshold, provided the auxiliary amplifier is biased in class B mode, it may be advantageous to continue to increase the input power of the main amplifier after transition, so that the main amplifier is driven to its "new" P1 dB compression point after the transition threshold.

Figure 7A:
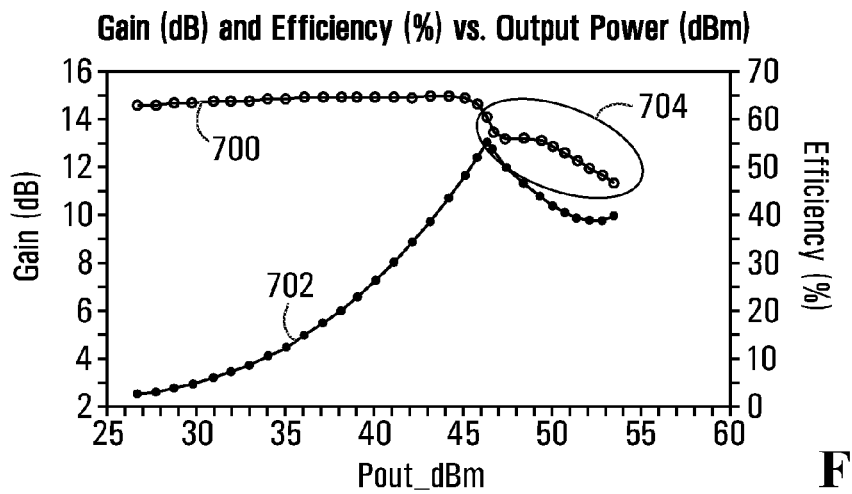
FIG. 7A is a plot of simulated gain and efficiency for a Doherty-type amplifier with all subsequent input power above a transition threshold voltage directed to the auxiliary amplifier according to an embodiment of the present invention.
Figure 7B:
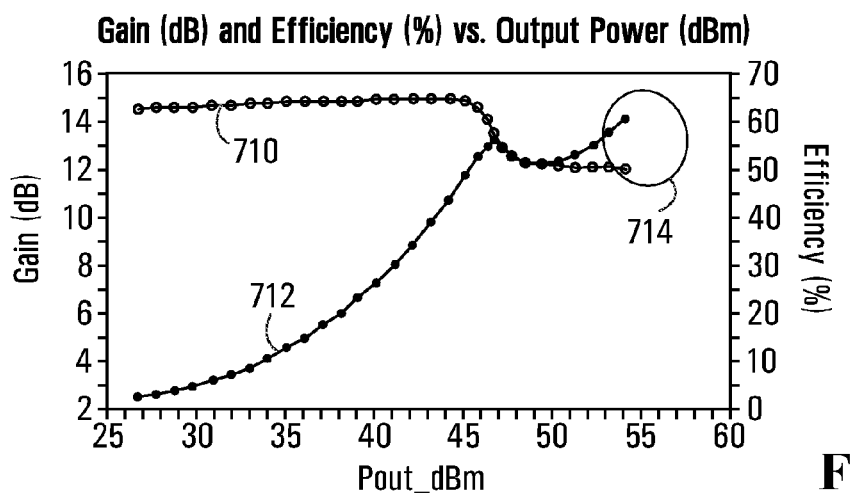
FIG. 7B is a plot of simulated gain and efficiency for a Doherty-type amplifier with all subsequent input power above a transition threshold voltage split equally between main amplifier and the auxiliary amplifier according to an embodiment of the present invention.
Figure 7C:
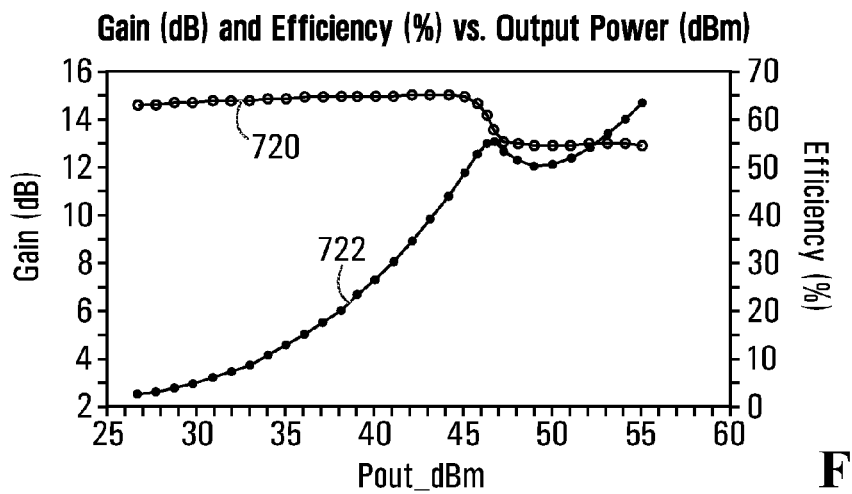
FIG. 7C is a plot of simulated gain and efficiency for a Doherty-type amplifier with all subsequent input power above a transition threshold voltage split unequally between main amplifier and the auxiliary amplifier according to an embodiment of the present invention.

Further discussion of potential post-transition power division strategies for embodiments in which the transition threshold voltage is targeted as the P1 dB compression input voltage of the main amplifier is now provided with reference to FIGS. 7A to 7C, which are plots of gain and efficiency versus output power for three post-transition power division strategies in a Doherty-type amplifier in accordance with embodiments of the present invention.

FIG. 7A is a plot of gain 700 and efficiency 702 versus output power for an embodiment in which all input subsequent input power to the transition threshold voltage is directed to the auxiliary amplifier, which is biased in class B. Here the reduction in output power provided by the main amplifier, generally indicated at 704, is evident as the output power does not reach 55 dBm and the associated efficiency is reduced.

FIG. 7B is a plot of gain 710 and efficiency 712 versus output power for an embodiment in which all subsequent input above the transition threshold voltage is split equally between the main and auxiliary amplifier. Here peak power and efficiency issues present in the results shown in FIG. 7A are resolved, as full potential of the main amplifier when terminated with 50 Ohm post-transition is achieved, as generally indicated at 714. However, the signal level to the main amplifier is too high as the device is now overly compressed beyond its P1 dB target level, which can potentially lead to difficulties in linearizing the amplifier.

FIG. 7C is a plot of gain 720 and efficiency 722 versus output power for an embodiment in which all subsequent input above the transition threshold is split asymmetrically between the main and auxiliary amplifiers. Here, as in FIG. 7B, the maximum power and efficiency issues are resolved, but unlike the results shown in FIG. 7B the gain 720 does not compress much beyond 1 dB until it nears the max power level.

In some embodiments, a ratio between the portion of the subsequent input above the transition threshold voltage that is directed to the main amplifier and the portion of the subsequent input above the transition threshold voltage that is directed to the auxiliary amplifier is based upon the maximum power ratings of the main and auxiliary amplifier.

The performance impacts of the electrical length and bandwidth of the combining and matching structures utilized in Doherty-type amplifiers are now discussed with reference to FIGS. 11 to 17.

The electrical length and the bandwidth of the matching structures used to match the main and auxiliary amplifiers in a Doherty-type amplifier impact the overall performance of the Doherty-type amplifier in back-off and through to saturation of the main amplifier. Specifically, the bandwidth and electrical length of the matching structures impact the target Cripps impedance presented to the main and auxiliary amplifiers, i.e., how well does the match correspond to the ideal Cripps impedance across frequency, and also impact the "off" impedance of the auxiliary amplifier that is transformed to the Doherty combiner structure, which would ideally be an open-circuit, i.e. infinite impedance. The 1 dB compression input voltage, gain and efficiency of the Doherty-type amplifier across a given frequency band of operation may all be effected by the electrical length and bandwidth of the matching structures utilized in the Doherty-type amplifier.

It should be noted that electrically "short" matching structures are generally narrow band and broader band matching structures generally add some additional electrical length in order to be realized.

The electrical length and bandwidth of the Doherty combining structure used to combine outputs of the main and auxiliary amplifiers in a Doherty-type amplifier only impact the performance of the Doherty-type amplifier in back-off. Specifically, the bandwidth of the impedance presented to the main amplifier in back-off is effected by the Doherty combining structure. In general, narrow band designs will introduce imaginary components in the impedance presented to the main amplifier in back-off, which can negatively impact performance, as the ideal impedance to be presented to the main amplifier in back-off is generally a purely real impedance, as described below with reference to FIGS. 11A and 11B.

The fundamental structure within a Doherty combining structure is the additional quarter wavelength length included in the main amplifier path. This length maintains quadrature between the main and auxiliary amplifier paths when both devices are on and acts as an impedance transformer when the auxiliary amplifier is off, as described herein with reference to FIGS. 6A and 6B. Typically, the additional quarter wavelength length in the main amplifier path is realized with a quarter wavelength length of microstrip with an impedance of X ohms, where X is an intermediate impedance of the design. For example, in FIGS. 6A and 6B, the quarter wavelength microstrip 604 has an impedance of 50 Ohms.

FIGS. 13A and 13B are schematic diagrams of Doherty-type amplifiers 1300 and 1310, respectively, with two alternative structures for realizing the additional quarter wavelength length in the main amplifier path of the Doherty-type amplifier.

In FIG. 13A, the Doherty-type amplifier 1300 includes a main amplifier 1302 and an auxiliary amplifier 1304 with a quarter wavelength microstrip 1306 included in the main amplifier path in order to realize the additional quarter wavelength length.

In FIG. 13B, the Doherty-type amplifier 1310 includes a main amplifier 1312, an auxiliary amplifier 1314 and a more complex structure, which includes a shorted stub 1316, is used to implement the additional quarter wavelength length in the main amplifier path.

Figure 14A:
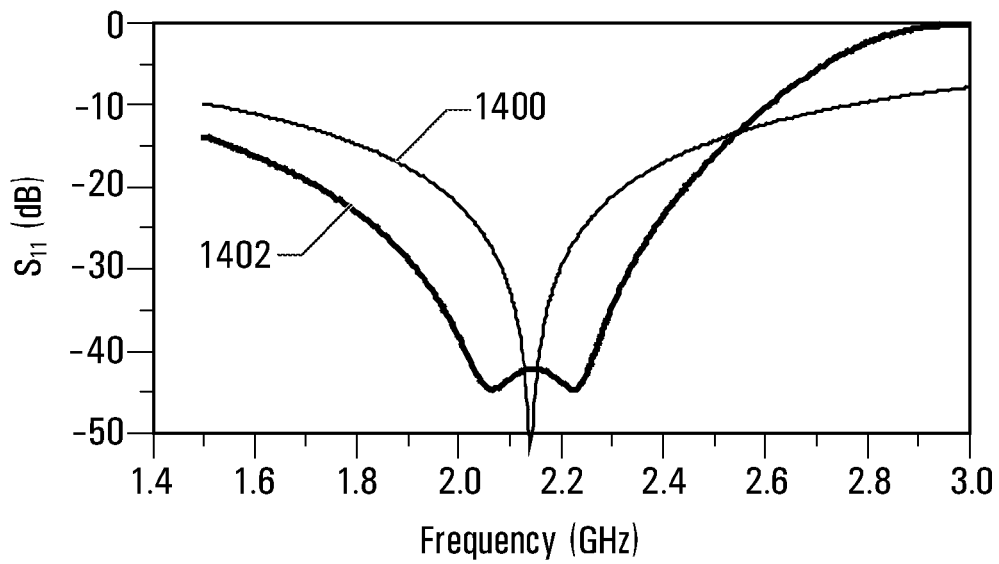
FIG. 14A is a plot of the simulated s-parameter s11 for the Doherty-type amplifiers shown in FIGS. 13A and 13B.
Figure 14B:
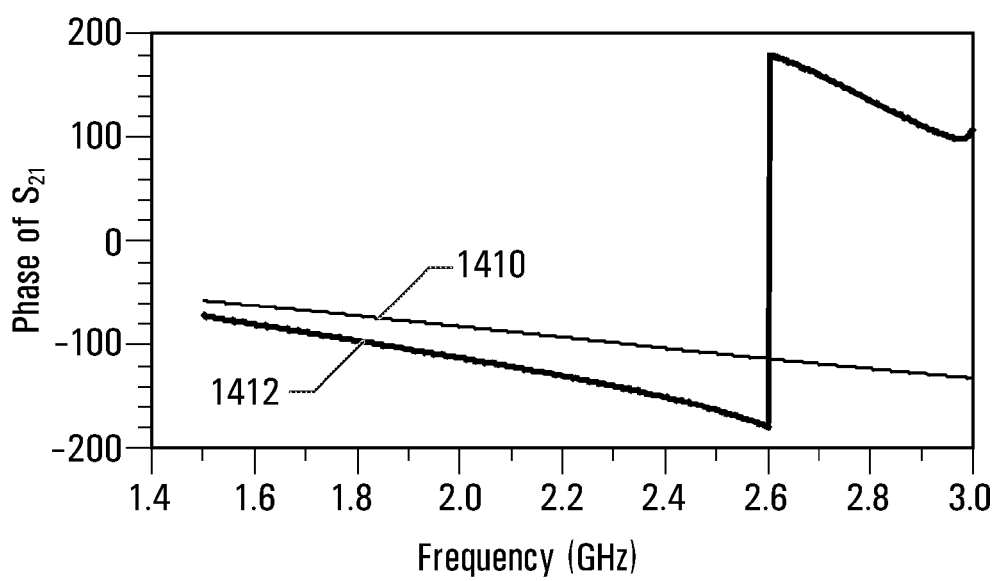
FIG. 14B is a plot of the simulated phase of the s-parameter s21 for the Doherty-type amplifiers shown in FIGS. 13A and 13B.

FIGS. 14A and 14B are plots of simulated results for the s-parameter s11 and the phase of the s-parameter s21, respectively, across frequency for the quarter wave microstrip 1306 and the shorted stub 1316 shown in FIGS. 13A and 13B. The s-parameter s11 is an indication of how well the input impedance presented by an element matches a target impedance, commonly 50 Ohm, while the phase of the s-parameter s21 indicates the phase transformation that the element imparts to a signal passing through it. Ideally, the element utilized to implement the additional quarter wavelength length in the main amplifier path would present the target impedance, i.e., that impedance which is ideally presented to the main amplifier when both amplifiers are on, for all frequencies of operation and the element would also present a quarter wavelength transformation, i.e., 90 degree phase shift, across all frequencies of operation.

The simulated s-parameter s11 results 1400 and 1402 shown in FIG. 14A for the quarter wavelength microstrip 1306 and the shorted stub 1316, respectively, clearly illustrate that for operating frequencies around 2.1 GHz a typical 30 dB bandwidth for a quarter wavelength microstrip provides only a narrowband match on the order of 110 MHz, while a shorted stub provides a broader match with a 30 dB bandwidth of approximately 420 MHz.

However, while the shorted stub 1316 may offer a broader match at operating frequencies around 2.1 GHz compared to the simple quarter wavelength microstrip 1306, the phase transformation provided by the shorted stub 1316, and other similar complex quarter wavelength structures, are typically less easily controlled across frequency.

The phase curve 1412 of the simulated s-parameter s21 for the shorted stub 1316 compared to the phase curve 1410 for the simple quarter wavelength microstrip 1306 illustrated in FIG. 14B clearly illustrate this design trade-off as the phase curve 1412 falls off more rapidly than the phase curve 1410 and also changes from leading to lagging phase at approximately 2.6 GHz. This rapid change from leading to lagging phase may not be a problem if it occurs outside of the frequency range of operation. For example, if the frequency range is assumed to be the 30 dB bandwidth of the shorted stub, the change in the phase curve 1412 at 2.6 GHz is outside the 30 dB bandwidth of the shorted stub indicated by the simulated s11 curve 1402 shown in FIG. 14A.

It should be appreciated that, in general, any quarter wavelength structure used to implement the additional quarter wavelength length in the main amplifier path of a Doherty-type amplifier that maintains both the integrity of the signal quadrature and the desired impedance transformation, while also improving overall bandwidth, will improve the performance of the Doherty-type amplifier.

Stated briefly, the general design guidelines for the output structure, i.e., the matching structure associated with the main and auxiliary amplifiers and the Doherty combining structure, of a Doherty-type amplifier in accordance with an embodiment of the present invention include:

i) the electrical length of the auxiliary amplifier path is equal to $n*(\lambda/2)$, or $n*180°$, where n is an integer;

ii) the electrical length of the main amplifier path is ¼, or 90°, longer than that of the auxiliary amplifier;

iii) broadband design practices/techniques are to be used if possible; and iv) the electrical length of the output structure is kept as short as possible.

In general, point iii) is often in conflict with the other guidelines, as broadband design practices/techniques, impedance matching and transformations often introduce additional electrical length. It has been found that one way to overcome this conflict is to incorporate the Doherty combining structure and as much of the matching structure as possible at the device, or even at the die, level, as any connections necessary to interconnect devices or dies to external matching or combining structures results in additional electrical length.

This point will now be demonstrated by way of example with reference to FIGS. 11, 12 and 15 to 17.

Figure 11A:
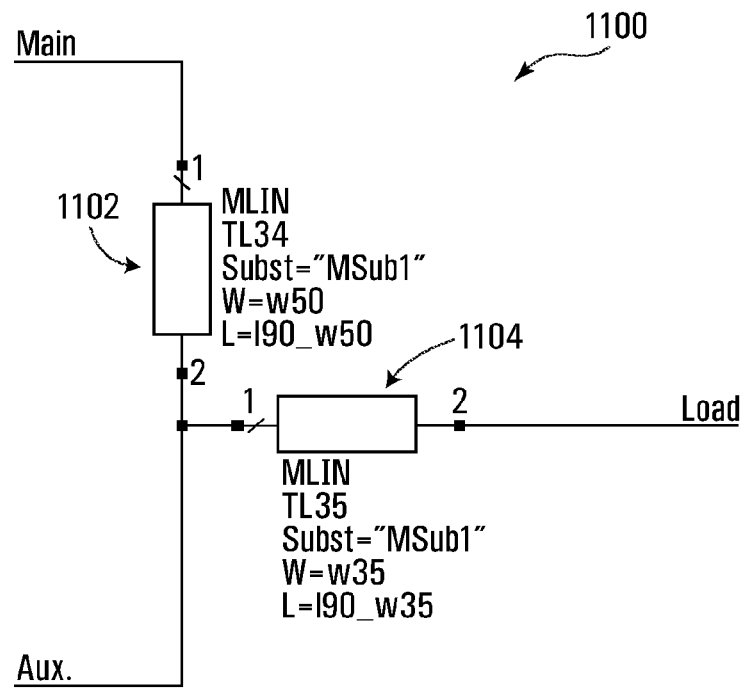
FIG. 11A is a schematic diagram of an idealized Doherty combining structure.

FIGS. 11A is a schematic diagram of an "ideal" Doherty combining structure 1100 that includes a first ideal quarter wavelength microstrip 1102 in the main amplifier path and a second ideal quarter wavelength microstrip 1104 at outputs of the main amplifier path and the auxiliary amplifier path. The Doherty combining structure 1100 is considered "ideal", since it is of minimum electrical length and maintains the integrity of the impedance transformation and quadrature of the main and auxiliary amplifier signals.

Figure 11B:
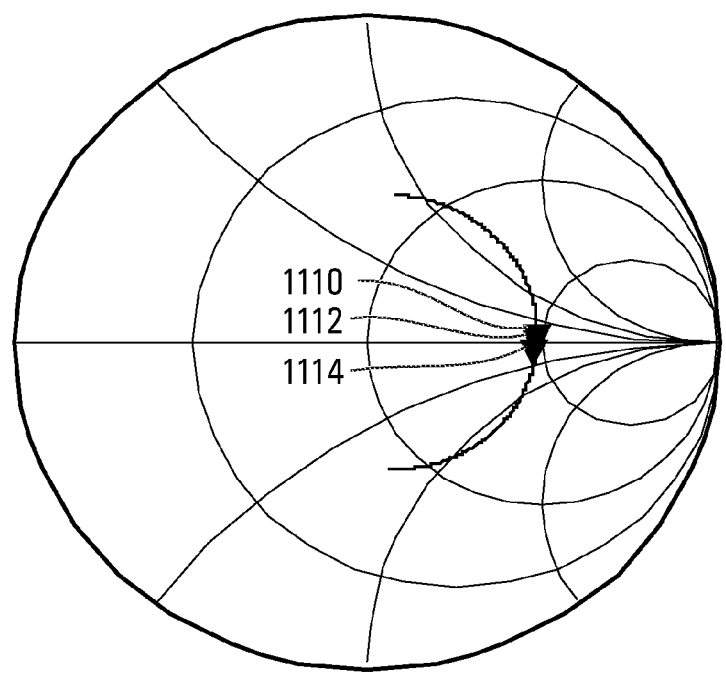
FIG. 11B is a Smith chart plot of the simulated s-parameter s11 for the idealized Doherty combining structure of FIG. 11A.

FIG. 11B is a smith chart plot of the simulated s-parameter s22 of the Doherty combiner structure 100 shown in FIG. 11A.

The smith chart plot shown in FIG. 11B represents the simulated s-parameter s22 across the frequency range of 1.28 GHz to 3 GHz. The s-parameter s22 is indicative of how well the output impedance of the Doherty combiner structure 1100 matches a desired load impedance. Three results 1100, 1112 and 1114 for operating frequencies of 2.11 GHz, 2.14 GHz and 2.17 GHz are noted in FIG. 11B. These three results 1100, 1112 and 1114 are grouped to the right hand side of the smith chart near the horizontal axis of the Smith chart, which suggests that a broadband structure providing "purely" real impedance values may be an ideal "real world" implementation of a Doherty combining structure.

Figure 12A:
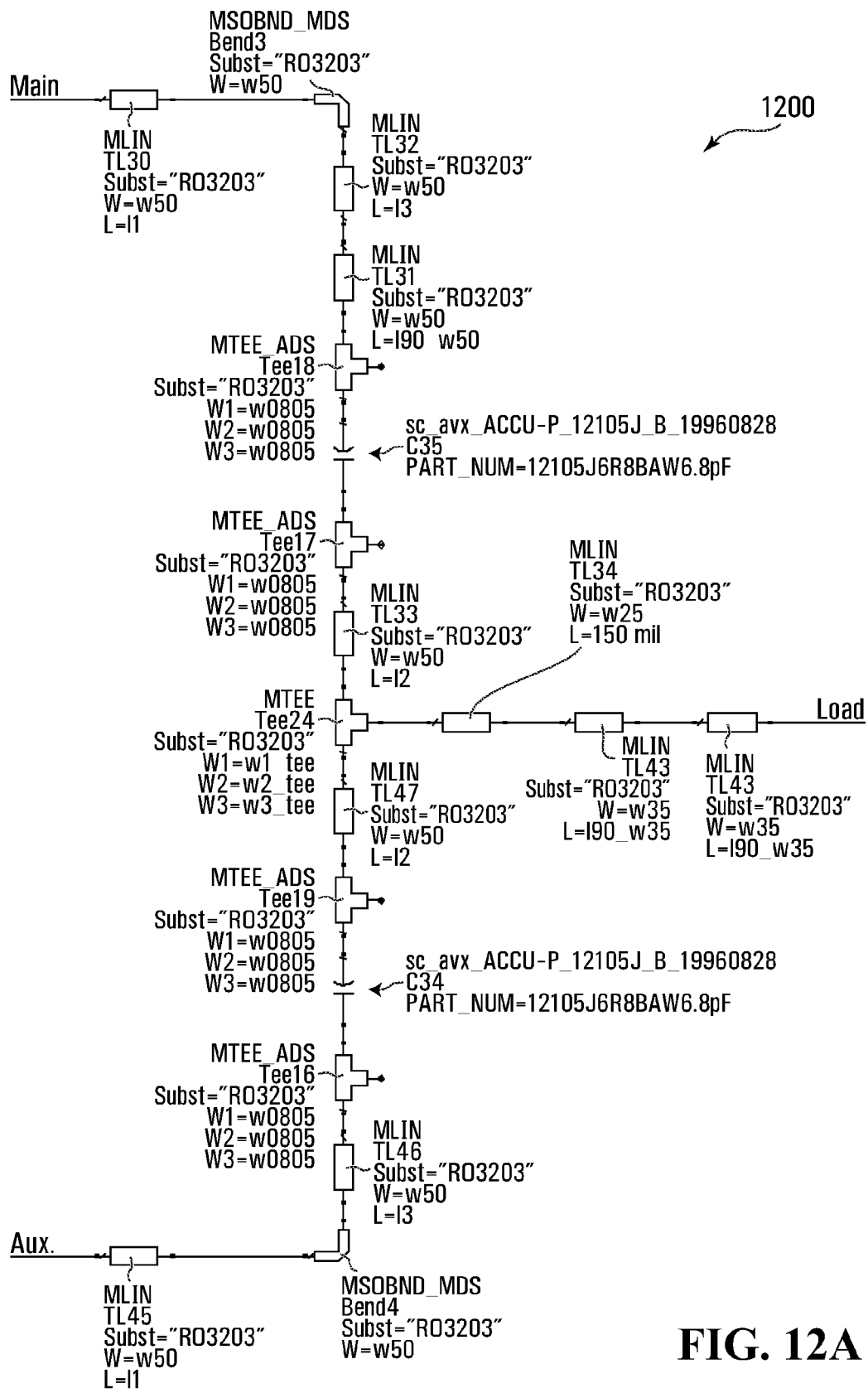
FIG. 12A is a schematic diagram of an improvised implementation of the idealized Doherty combining structure of FIG. 11A.

FIG. 12A is a schematic diagram of a more realistic implementation 1200 of a Doherty combiner structure than the "ideal" implementation 1100 shown in FIG. 11A. The implementation 1200 shown in FIG. 12 includes geometric elements representing examples of the physical components that may be used to implement and connect the ideal microstrips 1102 and 1104 shown in FIG. 11A.

FIG. 12B is a Smith chart plot of the simulated s-parameter s22 of the Doherty combiner structure 1200 shown in FIG. 12B. As in FIG. 11B, the smith chart plot shown in FIG. 12B represents the simulated s-parameter s22 across the frequency range of 1.28 GHz to 3 GHz. In FIG. 12B, the simulated result for s22 clearly shows that the improvised implementation shown in FIG. 12A introduces several wavelengths of electrical length, which emphasizes any error in the presented impedances. This is clearly illustrated by the s22 results 1210, 1212 and 1214 for frequencies of 2.11 GHz, 2.14 GHz and 2.17 GHz, respectively, which have deviated from the horizontal axis of the Smith chart and spread out in phase. This means that even if the s22 curve is rotated back such that the s22 result 1212 at 2.14 GHz is located on the horizontal axis of the Smith chart, i.e. purely real impedance, the spread in phase between the results 1210 and 1214 representing positive and negative reactances would effectively detune the load reducing the performance of the amplifier.

The simulation results in FIGS. 11A and 12A do not include the length of the associated device matching structure, e.g. the matching structure at the output of the Doherty-type amplifier after the Doherty combiner structure. Since the additional electrical length of any associated device matching structure would increase the total electrical length of the output structure, and would therefore emphasize any error in the presented impedances, the electrical lengths of Doherty amplifier matching structures are kept as short as possible in some embodiments of the present invention.

However, as noted above, electrically short structures are typically narrowband structures, which leads to a condition of diminishing returns as the electrical length of the matching structure is reduced, since eventually the bandwidth of the match may become so reduced as a consequence that it has a greater impact than the bandwidth of the combining structure.

Figure 16:
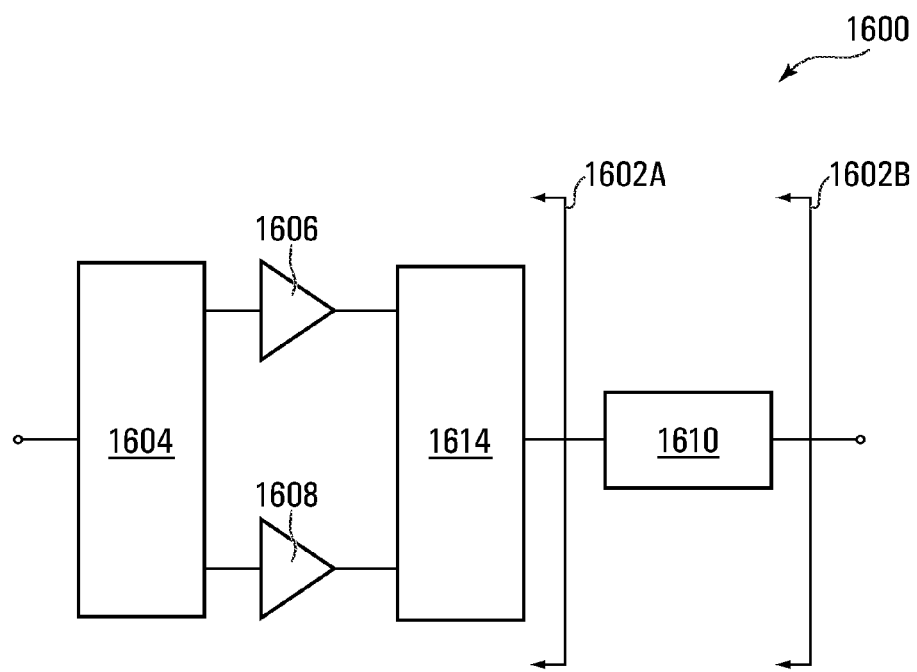
FIG. 16 is a schematic diagram of the Doherty-type amplifier on which the s-parameter s22 measurements shown in FIGS. 15A to 15C were made.

In order to further illustrate the role that bandwidth and electrical length of the output structure play in the performance of a Doherty-type amplifier, a Doherty-type amplifier utilizing two Infineon GM8 power amplifiers as the main and auxiliary amplifier was constructed and the performance of the constructed Doherty-type amplifier was tested across frequency. A schematic diagram of the test setup 1600 of the Doherty-type amplifier is shown in FIG. 16. The test setup includes an input signal splitter 1604, a main amplifier 1606 (Infineon GM8) an auxiliary amplifier 1608 (Infineon GM8), a Doherty combiner structure 1614 and one or more SMA connectors 1610 at the output of the Doherty combiner structure 1614 to provide connection to measurement equipment used to measure the s-parameter s22 at the output of the Doherty combiner structure.

Figure 15A:
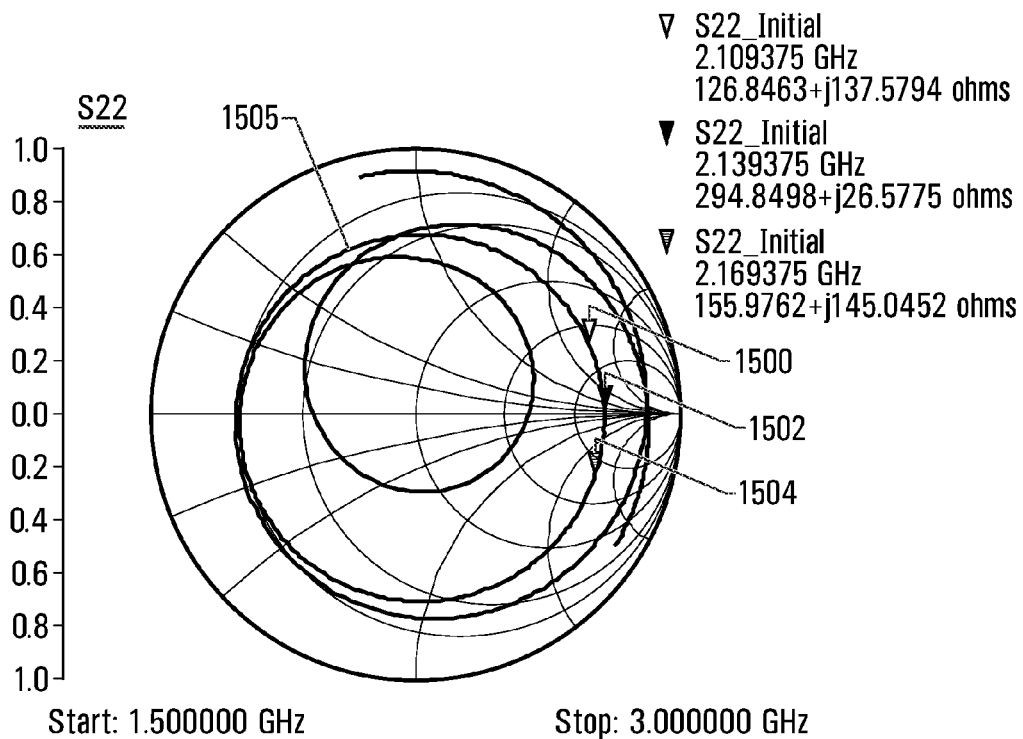
FIG. 15A is a Smith chart plot of the measured s-parameter s22 for a Doherty-type amplifier in accordance with an embodiment of the present invention, with the measurement equipment calibrated at a first reference plane of the device under test.

FIG. 15A is a Smith chart plot of the measured s-parameter s22 1505 for the test setup 1600 shown in FIG. 16, with the measurement equipment calibrated to a reference plane 1602A between the output of the Doherty combiner structure 1614 and the input of the SMA connector 1610 shown in FIG. 16. Calibration at the reference plane 1602A effectively removes the effect of the electrical length of the SMA connector 1610 from the measured results. The measured s-parameter s22 at three frequencies, 2.11 GHz, 2.14 GHz and 2.17 GHz, are highlighted at 1500, 1502 and 1504, respectively, in FIG. 15A. These results represent a narrowband solution of "purely" real values at 2.14 GHz, as the results 1502 for 2.14 GHz is toward the right hand edge and near the horizontal "real" axis of the Smith chart, while the results 1500 and 1504 at 2.11 GHz and 2.17 GHz, respectively, contain significant reactance components.

In order to demonstrate the performance impact of the electrical length of the Doherty output structure, which typically includes a Doherty combiner, such as the Doherty combiner structure 1614 shown in FIG. 16, and any associated matching structure, the measurement equipment was recalibrated to a second reference plane 1602B, as shown in FIG. 16. This recalibration allowed the effect of the electrical length of the SMA connector 1610 to be included in the measured s-parameter s22.

Figure 15B:
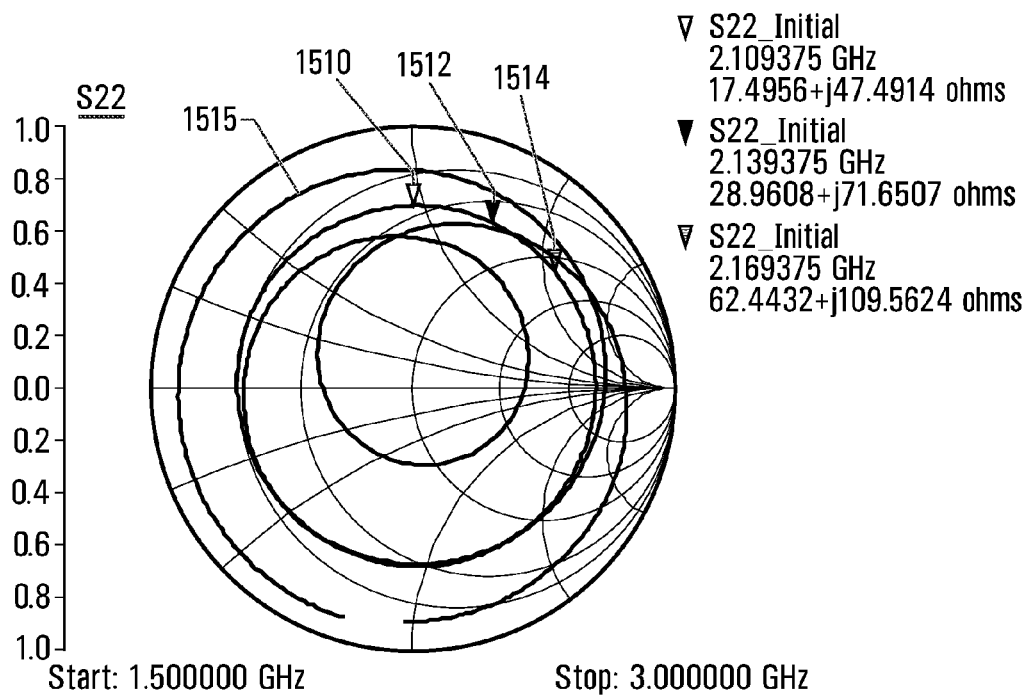
FIG. 15B is a Smith chart plot of the measured s-parameter s22 for a Doherty-type amplifier in accordance with an embodiment of the present invention, with the measurement equipment calibrated at a second reference plane of the device under test.

FIG. 15B is a Smith chart plot of the measured s-parameter s22 1515 for the test setup 1600 shown in FIG. 16, with the measurement equipment calibrated to the reference plane 1602B. As in FIG. 15A, the measured s-parameter s22 at 2.11 GHz, 2.14 GHz and 2.17 GHz, are highlighted at 1510, 1512 and 1514, respectively, in FIG. 15B. It is clear from the measured results shown in FIG. 15B that the electrical length of the SMA connector 1610, which is now included the measured results, has caused the measured s-parameter s22 to rotate away from the "purely" real narrowband results indicated at 2.14 GHz in FIG. 15A for the calibration reference plane 1602A.

By varying the electrical length of the SMA connection between the Doherty combiner structure 1614 and the measurement equipment by using one or more SMA connectors with a different total combined electrical length different than the electrical length of the SMA connector that produced the results 1515 shown in FIG. 15B, it was found that it was possible to "tune" the SMA interconnection with a different combined electrical length of the SMA connection for each of the three frequencies 2.11 GHz, 2.14 GHz and 2.17 GHz. FIG. 15A demonstrates that a "purely" real result was obtained at 2.14 GHz with the electrical length of the original SMA connector 1610. In order to mitigate the positive and negative reactances in the results 1500 and 1504 at 2.11 GHz and 2.17 GHz, respectively, measurements of the s-parameter s22 were repeated first with an SMA connector with a longer overall electrical length than the original SMA connector 1610 and then again with an SMA connector with a shorter overall electrical length than the original SMA connector.

Figure 15C:
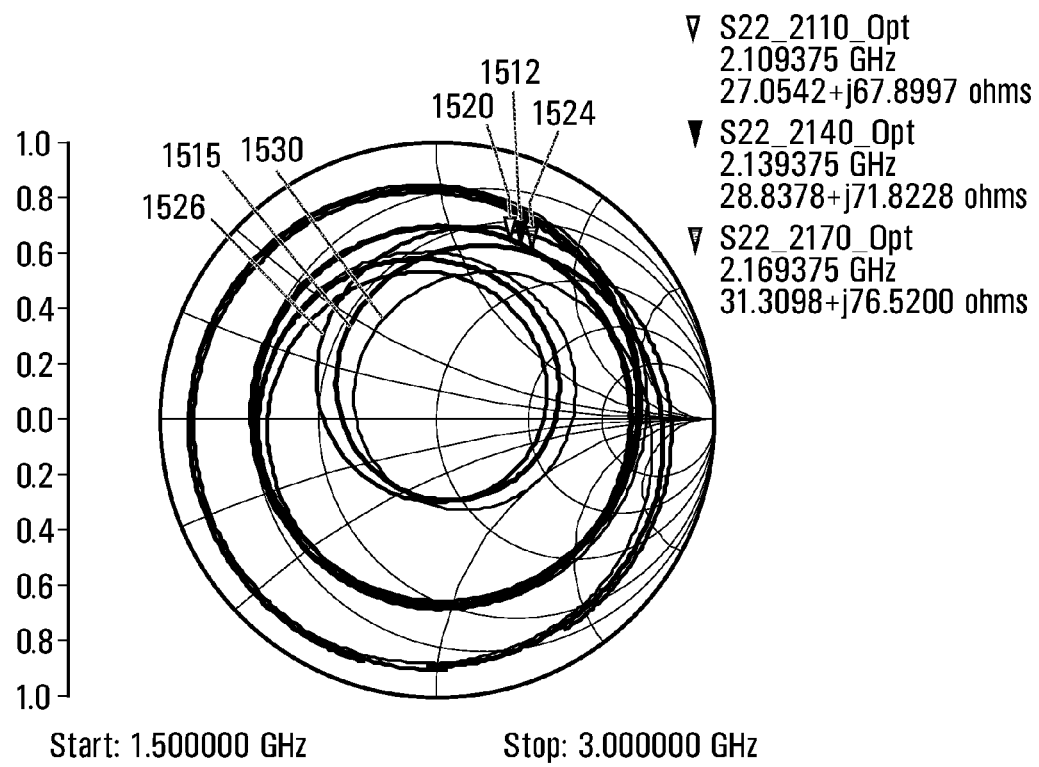
FIG. 15C is a Smith chart plot of the measured s-parameter s22 for a Doherty-type amplifier with the electrical length of the Doherty output structure optimized across frequency in accordance with an embodiment of the present invention.

FIG. 15C is a Smith chart plot of the measured s-parameter s22 with the original SMA connector 1610, generally indicated at 1515, with the shorter SMA connector, generally indicated at 1526, and with the longer SMA connector, generally indicated at 1530. The results at 2.11 GHz, 2.14 GHz and 2.17 GHz for the three curves 1530, 1515 and 1526, respectively, are highlighted at 1520, 1512 and 1524 in FIG. 15C. As can be seen in FIG. 15C, the different electrical lengths of the SMA connector at the output of the Doherty-type amplifier for the three configuration measurements 1530, 1515 and 1526 shown in FIG. 15C has caused the s-parameter s22 1520 measured at 2.11 GHz for the longer configuration and the s-parameter s22 1524 measured at 2.17 GHz for the longer configuration to converge with the s-parameter s22 1515 measured for the original configuration. This convergence demonstrates that the detuning caused by the electrical length of the original SMA connector, i.e., the reactances in the measured s-parameter s22 results 1500 and 1504 at 2.11 GHz and 2.17 GHz shown in FIG. 15A, could be mitigated by reducing the overall electrical length of the SMA connector 1610.

It should be noted that it is assumed that the convergence in the results shown in FIG. 15C, which were made with the measurement calibrated to the second reference plane 1602B, will translate back down to the initial reference plane 1602A at the output of the Doherty combiner structure 1614.

The performance impacts of the s22 optimization illustrated in FIG. 15C are now discussed with reference to FIGS. 17A to 17C.

Figure 17A:
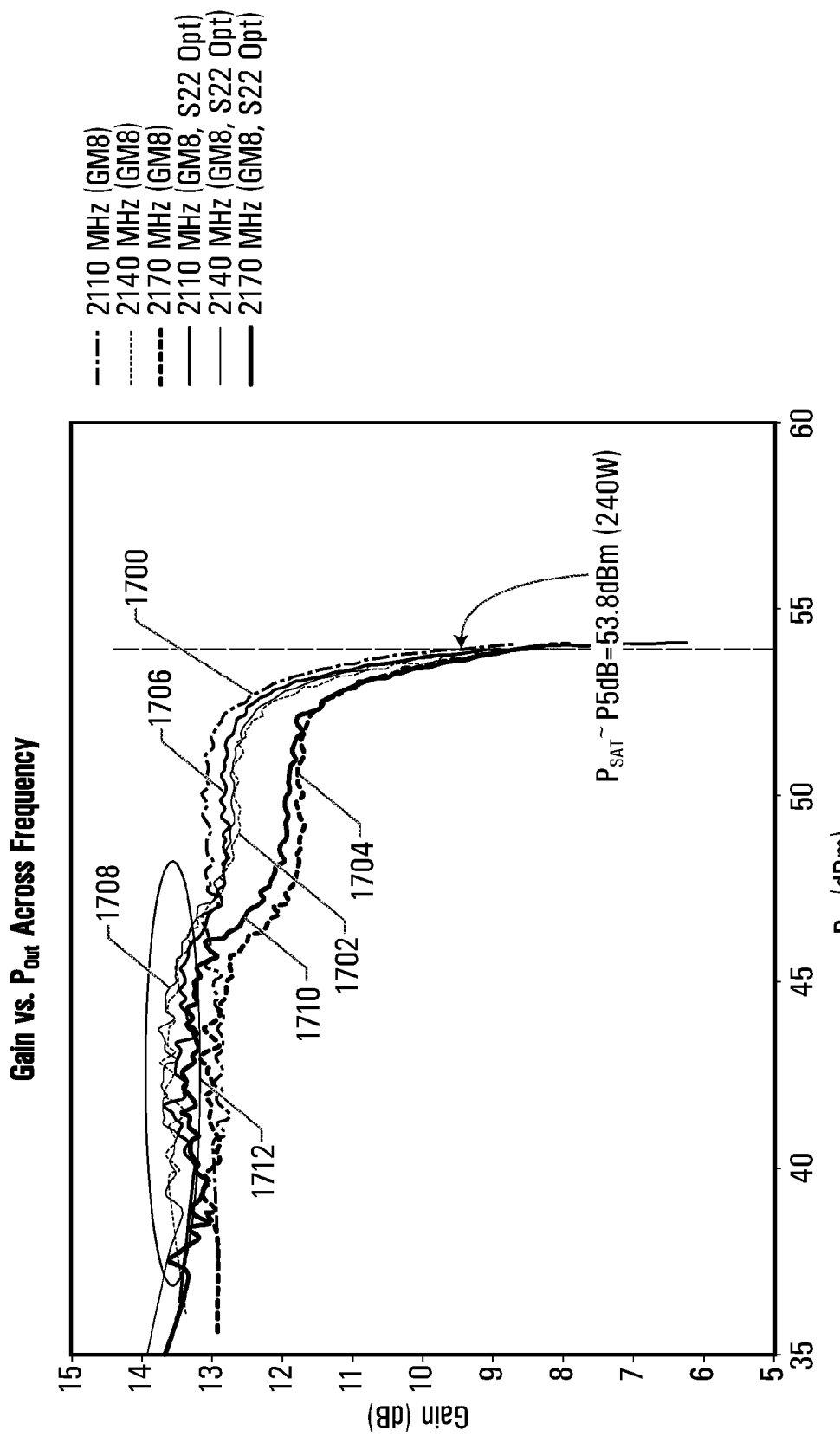
FIG. 17A is a plot of measured gain versus output power across frequency for the Doherty-type amplifier shown in FIG. 16, both with and without the optimization of the Doherty output structure, according to an embodiment of the invention.

FIG. 17A is a plot of measured gain versus output power across frequency for the three SMA connector configurations described above with reference to FIGS. 15C and 16. FIG. 17A includes three results 1700, 1702 and 1704 for the gain of the Doherty-type amplifier for the original SMA connector at frequencies of 2.11 GHz, 2.14 GHz and 2.17 GHz, respectively. FIG. 17A also includes three gain curves 1706, 1708 and 1710 for the longer SMA connector, the original SMA connector, and the shorter SMA connector, respectively, at frequencies of 2.11 GHz, 2.14 GHz and 2.17 GHz, respectively. It is noted that the curves 1702 and 1708 are both measurements made at 2.14 GHz with the original SMA connector, and therefore should agree with one another as shown in FIG. 17A.

The results in FIG. 17A clearly show a more consistent gain profile in back-off across frequencies for the optimized configurations. Specifically, the gain profiles 1706, 1708 and 1710 have converged in the region generally indicated at 1712 in FIG. 17A. However, the remaining variance in the gain profiles above 45 dBm output power suggests that further optimization is possible.

Figure 17B:
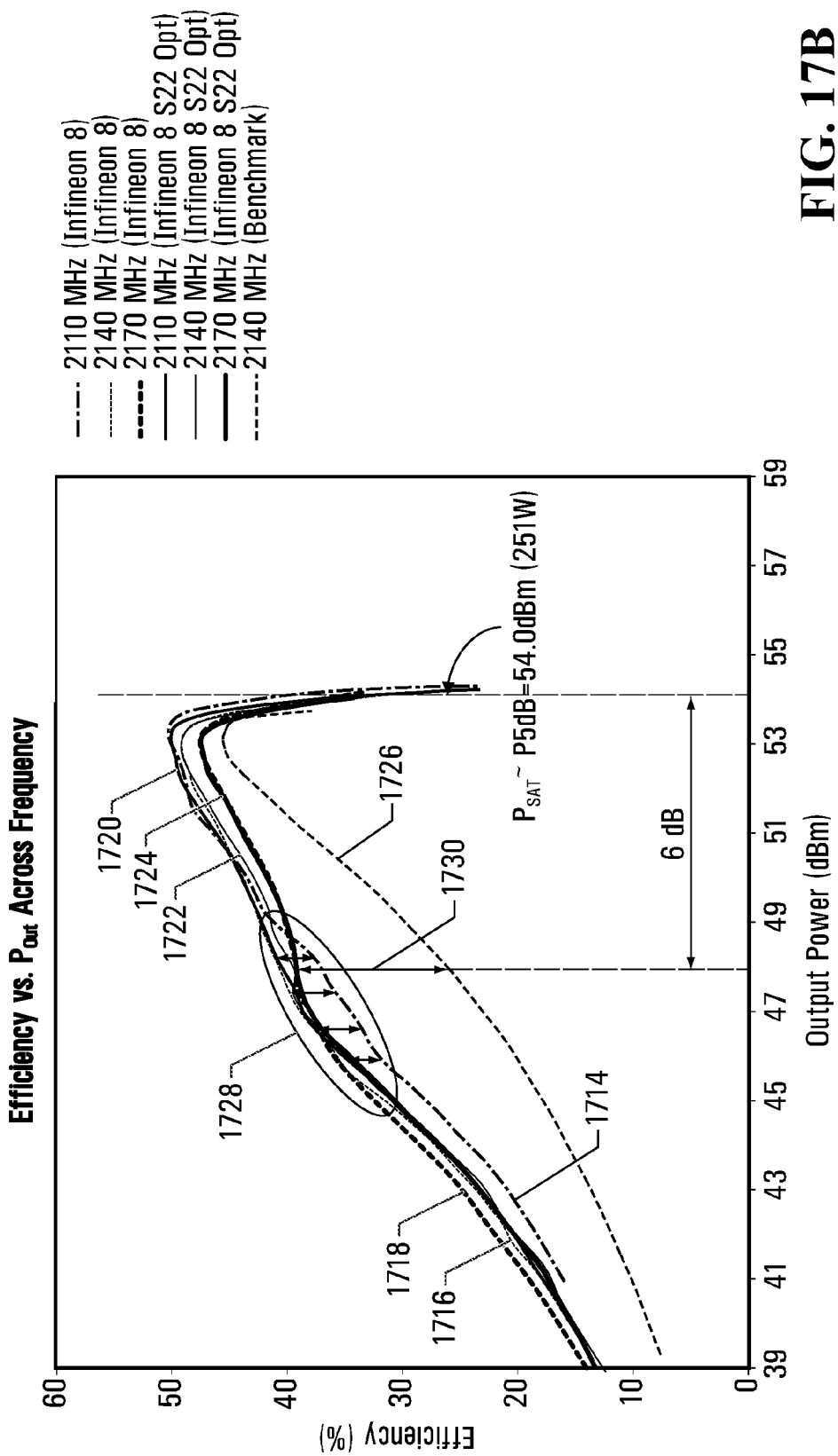
FIG. 17B is a plot of measured efficiency versus output power across frequency for the Doherty-type amplifier shown in FIG. 16, both with and without the optimization of the Doherty output structure, according to an embodiment of the invention.

FIG. 17B is a plot of efficiency versus output power across frequency for the three SMA connector configurations described above with reference to FIGS. 15C and 16. FIG. 17B includes three results 1714, 1716 and 1718 for the efficiency of the Doherty-type amplifier for the original SMA connector at frequencies of 2.11 GHz, 2.14 GHz and 2.17 GHz, respectively. FIG. 17B also includes three efficiency curves 1720, 1722 and 1724 for the longer SMA connector, the original SMA connector, and the shorter SMA connector, respectively, at frequencies of 2.11 GHz, 2.14 GHz and 2.17 GHz, respectively. It is noted that the efficiency curves 1716 and 1722 are both measurements made at 2.14 GHz with the original SMA connector, and therefore should agree with one another as shown in FIG. 17B.

In accordance with the improvement seen in the gain profiles seen in the back-off region of operation in FIG. 17A, the efficiency curves 1720, 1722 and 1724 for the optimized configurations plotted in FIG. 17B show improved consistency in the back-off region of operation below 47 dBm output power and the droop in back-off in the efficiency curve 1714 for the original configuration operating at 2.11 GHz has been mitigated, as clearly indicated at 1728 in FIG. 17B.

For the sake of comparison, FIG. 17B also includes an efficiency curve 1726 for a conventional Class AB biased power amplifier operating at 2.14 GHz. The first peak in the efficiency curves 1722 for the Doherty-type amplifier provides an increase in efficiency of almost 13%, generally indicated at 1730 in FIG. 17B, over the efficiency curve 1726 for the conventional Class AB biased power amplifier at 48 dBm of output power. Again, the variance in the efficiency curves 1720, 1722 and 1724 in the saturation region above 48 dBm of output power suggests that further optimization may be possible.

Figure 17C:
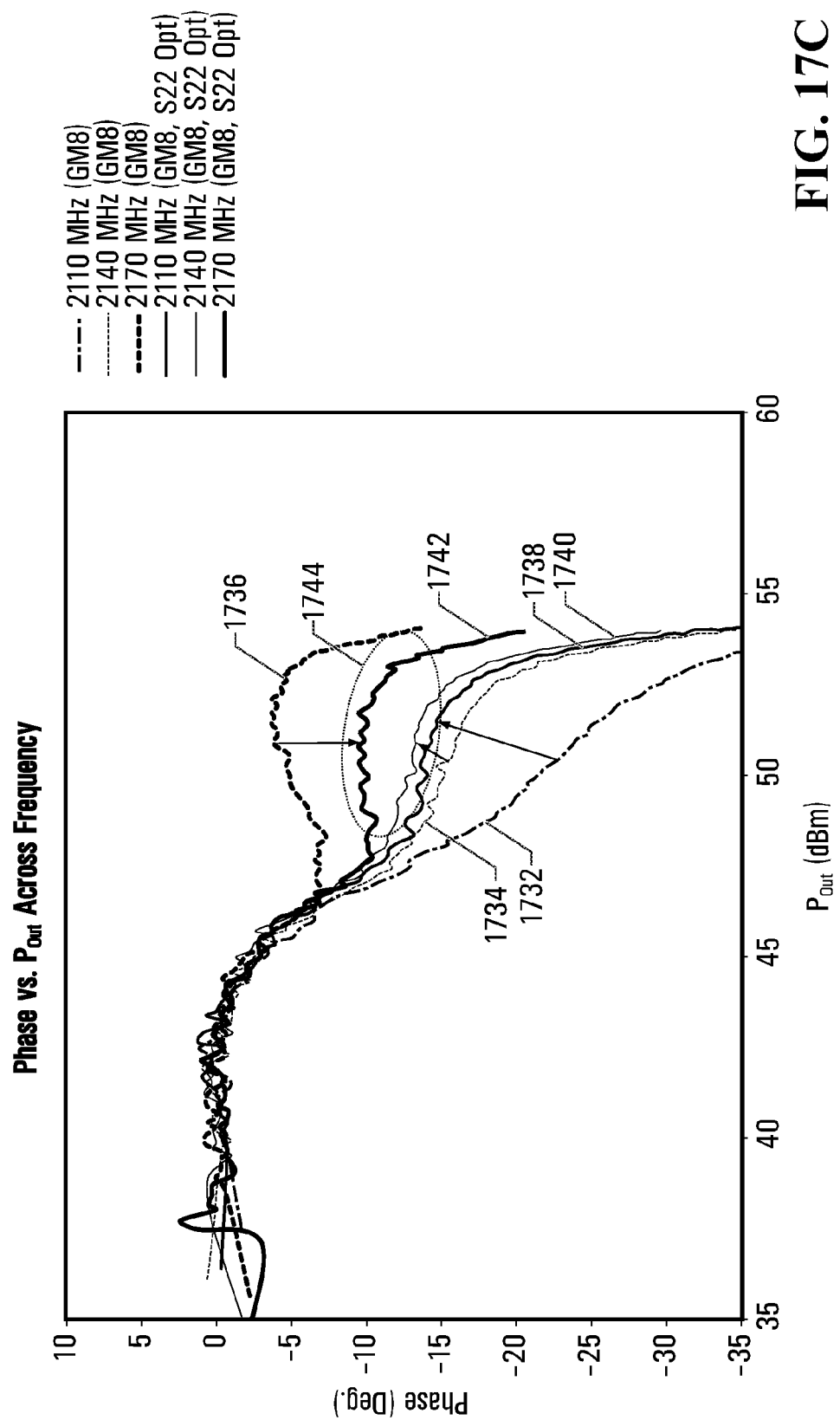
FIG. 17C is a plot of the measured phase introduced by the Doherty-type amplifier shown in FIG. 16 for various frequencies, both with and without the optimization of the Doherty output structure, according to an embodiment of the invention.

FIG. 17C is a plot of the phase introduced by the Doherty-type amplifier versus output power across frequency for the three SMA connector configurations described above with reference to FIGS. 15C and 16. FIG. 17C includes three results 1732, 1734 and 1736 for the phase change introduced by the Doherty-type amplifier with the original SMA connector at frequencies of 2.11 GHz, 2.14 GHz and 2.17 GHz, respectively. FIG. 17C also includes three phase curves 1738, 1740 and 1742 for the longer SMA connector, the original SMA connector, and the shorter SMA connector, respectively, at frequencies of 2.11 GHz, 2.14 GHz and 2.17 GHz, respectively.

It is noted in FIG. 17C that after optimization there is a general convergence of AM-PM (Amplitude Modulation to Phase Modulation) response across frequency in saturation, as evidenced by the convergence of the phase curves 1738, 1740 and 1742 in the region generally indicated at 1744, whereas, the phase curves 1732, 1734 and 1736 for the original configuration vary widely in that region. AM-PM response is an unwanted conversion of amplitude variation into phase variation in the output of the amplifier. Accordingly, the convergence in the AM-PM response across frequency of the optimized configurations represents a performance improvement.

It should be understood that as used herein, terms such as coupled, connected, electrically connected, in signal communication, and the like may include direct connections between components, indirect connections between components, or both, as would be apparent in the overall context of a particular embodiment. The term coupled is intended to include, but not be limited to, a direct electrical connection.

It must be further understood that the simulated and measured results described herein and illustrated in the Figures are provided by way of example only and were made under conditions. Under other actual or simulation conditions, similar or possibly different results may be achieved.

Although this disclosure describes specific implementations of Doherty-type amplifiers using semiconductor devices with unequal, or asymmetric, power ratings, i.e., Asymmetric or Enhanced asymmetric Doherty-type amplifiers, the same or similar approach can be used for all Doherty-type architectures, including a traditional symmetric Doherty-type design, in order to achieve higher gain.

The foregoing description includes many detailed and specific embodiments that are provided by way of example only, and should not be construed as limiting the scope of the present invention. Alterations, modifications and variations may be effected to the particular embodiments by those of skill in the art without departing from the scope of the invention, which is defined solely by the claims appended hereto.

The invention claimed is:

1. An amplifier arrangement for amplifying an amplifier arrangement input, the amplifier arrangement comprising:
   a main amplifier path comprising a main amplifier;
   at least one auxiliary amplifier path comprising an auxiliary amplifier;
   a combining structure configured to combine outputs of the main and auxiliary amplifiers;
   a signal preparation element operable to develop a main amplifier input signal for coupling to the main amplifier path and at least one auxiliary amplifier input signal for coupling to the at least one auxiliary amplifier path as a function of the amplifier arrangement input and a transition threshold associated with the amplifier arrangement input; and
   a bias controller operable to bias the at least one auxiliary amplifier as a class B amplifier.

2. The amplifier arrangement of claim 1, wherein the bias controller is operable to bias the auxiliary amplifier substantially at a turn-on voltage of the auxiliary amplifier.

3. The amplifier arrangement of claim 1, wherein the signal preparation element is operable:
   to develop the main amplifier input signal with substantially all of the amplifier arrangement input for amplifier arrangement input levels that are below the transition threshold; and
   to redirect at least a portion of the amplifier arrangement input to develop the at least one auxiliary amplifier input for amplifier arrangement input levels that are above the transition threshold.

4. The amplifier arrangement of claim 3, wherein the signal preparation element is operable to asymmetrically divide the amplifier arrangement input above the transition threshold between the main amplifier input signal and the at least one auxiliary amplifier input signal.

5. The amplifier arrangement of claim 4, wherein the signal preparation element is operable to asymmetrically divide the amplifier arrangement input above the transition threshold based on a ratio between power ratings of the main amplifier and the at least one auxiliary amplifier.

6. The amplifier arrangement of claim 1, comprising a plurality of auxiliary amplifier paths, wherein the signal preparation element is operable to develop the main amplifier input signal for the main amplifier path and to develop a respective auxiliary amplifier input for each of the auxiliary amplifier paths based on a plurality of respective transition thresholds.

7. The amplifier arrangement of claim 1, further comprising a matching structure operable to substantially match outputs of the main amplifier path and the at least one auxiliary amplifier path to a load impedance.

8. The amplifier arrangement of claim 1, wherein the main amplifier and the at least one auxiliary amplifier are asymmetrically sized in terms of power ratings.

9. The amplifier arrangement of claim 1, wherein the main amplifier and the at least one auxiliary amplifier are fabricated in different semiconductor technologies.

10. The amplifier arrangement of claim 1, wherein the main amplifier and the at least one auxiliary amplifier are in a common package.

11. A method of controlling an amplifier arrangement, the amplifier arrangement comprising a main amplifier path and at least one auxiliary amplifier path, the main amplifier path comprising a main amplifier and the at least one auxiliary amplifier path comprising an auxiliary amplifier, the method comprising:
    biasing the at least one auxiliary amplifier as a class B amplifier; and
    developing a main amplifier input signal for coupling to the main amplifier path and developing at least one auxiliary amplifier input signal for coupling to the at least one auxiliary amplifier path as a function of the amplifier arrangement input and a transition threshold associated with amplifier arrangement input.

12. The method of claim 11, comprising biasing the auxiliary amplifier substantially at a turn-on voltage of the auxiliary amplifier.

13. The method of claim 11, wherein developing the main amplifier input signal and the auxiliary amplifier input signal comprises:
    developing the main amplifier input signal with substantially all of the amplifier arrangement input for amplifier arrangement input levels that are below the transition threshold; and
    redirecting at least a portion of the amplifier arrangement input to develop the at least one auxiliary amplifier input for amplifier arrangement input levels that are above the transition threshold.

14. The method of claim 13, wherein the signal preparation element is operable to asymmetrically divide the amplifier arrangement input above the transition threshold between the main amplifier input signal and the at least one auxiliary amplifier input signal.

15. The method of claim 14, wherein redirecting at least a portion of the amplifier arrangement input to develop the at least one auxiliary amplifier input for amplifier arrangement input levels that are above the transition threshold comprises asymmetrically dividing the amplifier arrangement input above the transition threshold based on a ratio between power ratings of the main amplifier and the at least one auxiliary amplifier.

16. The method of claim 11, wherein the amplifier arrangement comprises a plurality of auxiliary amplifier paths, wherein developing a main amplifier input signal for coupling to the main amplifier path and developing at least one auxiliary amplifier input signal comprises developing the main amplifier input signal for the main amplifier path and developing a respective auxiliary amplifier input for each of the auxiliary amplifier paths based on a plurality of respective transition thresholds.

17. The method of claim 11, further comprising matching outputs of the main amplifier path and the at least one auxiliary amplifier path to a load impedance.

18. The method of claim 11, wherein the main amplifier and the at least one auxiliary amplifier are asymmetrically sized in terms of power ratings.

19. The method of claim 11, wherein the main amplifier and the at least one auxiliary amplifier are fabricated in different semiconductor technologies.

20. The method of claim 11, wherein the main amplifier and the at least one auxiliary amplifier are in a common package.

21. A base station comprising the amplifier arrangement of claim 1.

22. A mobile communication device comprising the amplifier arrangement of claim 1.

* * * * *